(12) United States Patent
Wang et al.

(10) Patent No.: US 11,980,055 B2
(45) Date of Patent: May 7, 2024

(54) DISPLAY DEVICE AND DISPLAY METHOD THEREOF

(71) Applicant: BOE TECHNOLOGY GROUP CO., LTD., Beijing (CN)

(72) Inventors: Wei Wang, Beijing (CN); Meng Yan, Beijing (CN); Qiuyu Ling, Beijing (CN); Xiandong Meng, Beijing (CN); Gaolei Xue, Beijing (CN); Xiaochuan Chen, Beijing (CN); Xue Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 657 days.

(21) Appl. No.: 17/253,962

(22) PCT Filed: Mar. 19, 2020

(86) PCT No.: PCT/CN2020/080287
§ 371 (c)(1),
(2) Date: Dec. 18, 2020

(87) PCT Pub. No.: WO2021/184324
PCT Pub. Date: Sep. 23, 2021

(65) Prior Publication Data
US 2022/0052297 A1 Feb. 17, 2022

(51) Int. Cl.
*H10K 50/858* (2023.01)
*G02B 3/00* (2006.01)
(Continued)

(52) U.S. Cl.
CPC ......... *H10K 50/858* (2023.02); *G02B 3/0056* (2013.01); *H10K 59/128* (2023.02); *H10K 59/353* (2023.02)

(58) Field of Classification Search
CPC .. H10K 50/858; H10K 59/128; H10K 59/353; H10K 59/121; H10K 59/879; G02B 3/0056; G02B 27/017
See application file for complete search history.

(56) References Cited

U.S. PATENT DOCUMENTS 6,046,787 A * 4/2000 Nishiguchi .......... H04N 13/341
348/E13.058
2005/0117347 A1 6/2005 Melpignano et al.
(Continued)

FOREIGN PATENT DOCUMENTS

CN 107561723 A 1/2018
CN 110221440 A 9/2019
(Continued)

OTHER PUBLICATIONS

European Application No. 20922486.4, Extended European Search Report, dated Mar. 27, 2023.
(Continued)

*Primary Examiner* — Herve-Louis Y Assouman
(74) *Attorney, Agent, or Firm* — Dinsmore & Shohl LLP

(57) ABSTRACT

The present disclosure provides a display device and a display method thereof. The display device includes a microlens array including a plurality of microlenses; and a display panel including a plurality of pixel islands, wherein the plurality of pixel islands are arranged in one-to-one correspondence with the plurality of microlenses, each pixel island includes a plurality of sub-pixels, light emitted by the plurality of sub-pixels of each pixel island enters a human eye through a microlens corresponding to the each pixel island and forms an image in the human eye, and regions where images formed by at least two pixel islands in the plurality of pixel islands via microlenses corresponding to the at least two pixel islands are located are connected.

17 Claims, 15 Drawing Sheets

(51) Int. Cl.
  *H10K 59/121* (2023.01)
  *H10K 59/128* (2023.01)
  *H10K 59/35* (2023.01)
  *H10K 59/80* (2023.01)

(56) References Cited

U.S. PATENT DOCUMENTS

| | | |
|---|---|---|
| 2005/0195491 A1 | 9/2005 | Bernard et al. |
| 2008/0239499 A1 | 10/2008 | Fukuda |
| 2010/0271467 A1* | 10/2010 | Akeley ............... H04N 13/385 348/59 |
| 2017/0038589 A1 | 2/2017 | Jepsen |
| 2019/0250418 A1* | 8/2019 | Lo ..................... G02B 3/0037 |
| 2020/0057306 A1* | 2/2020 | Ha ..................... G02B 3/0056 |
| 2020/0251689 A1 | 8/2020 | Pan et al. |
| 2021/0057493 A1 | 2/2021 | Liu et al. |
| 2021/0063737 A1 | 3/2021 | Ling et al. |
| 2021/0134844 A1 | 5/2021 | Liu |

FOREIGN PATENT DOCUMENTS

| | | |
|---|---|---|
| CN | 110459577 A | 11/2019 |
| CN | 110488494 A | 11/2019 |
| JP | 2005227334 A | 8/2005 |
| JP | 2005250478 A | 9/2005 |
| JP | 2007003984 A | 1/2007 |
| JP | 2007086500 A | 4/2007 |
| JP | 2009244662 A | 10/2009 |
| JP | 2011191595 A | 9/2011 |
| WO | 2018217253 A1 | 11/2018 |
| WO | 2019076314 A1 | 4/2019 |
| WO | 2020024848 A1 | 2/2020 |

OTHER PUBLICATIONS

Notice of Reasons for Refusal issued Feb. 26, 2024 relating to Japanese Patent Application No. 2021-567867. pp. 1-12.

* cited by examiner

DISPLAY DEVICE AND DISPLAY METHOD THEREOF

CROSS-REFERENCE TO RELATED APPLICATIONS

The present application is a U.S. National Stage Application under 35 U.S.C. § 371 of International Patent Application No. PCT/CN2020/080287, filed on Mar. 19, 2020, the disclosure of which is incorporated by reference herein in its entirety.

TECHNICAL FIELD

The present disclosure relates to a display device and a display method thereof.

BACKGROUND

At present, near-eye display devices are receiving more and more attention. Common near-eye display devices comprise VR (Virtual Reality) devices, AR (Augmented Reality) devices, or the like. The VR devices and the AR devices may realize light field display based on the principle of integrated imaging.

SUMMARY

According to an aspect of embodiments of the present disclosure, a display device is provided. The display device comprises: a microlens array comprising a plurality of microlenses; and a display panel comprising a plurality of pixel islands, wherein the plurality of pixel islands are arranged in one-to-one correspondence with the plurality of microlenses, each of the plurality of pixel islands comprises a plurality of sub-pixels, light emitted by the plurality of sub-pixels of each of the plurality of pixel islands enters a human eye through a microlens corresponding to the each of the plurality of pixel islands and forms an image in the human eye, and regions where images formed by at least two pixel islands in the plurality of pixel islands via microlenses corresponding to the at least two pixel islands are located are connected.

In some embodiments, the plurality of pixel islands comprise a first pixel island and a second pixel island, a first connection line between a center of the first pixel island and a center of a microlens corresponding to the first pixel island is not parallel to a second connection line between a center of the second pixel island and a center of a microlens corresponding to the second pixel island.

In some embodiments, in the plurality of pixel islands, a connection line between a center of a pixel island with a viewing angle of 0 degree and a center of a microlens corresponding to the pixel island with the viewing angle of 0 degree is perpendicular to the display panel, and a connection line between a center of a pixel island with a viewing angle other than 0 degree and a center of a microlens corresponding to the pixel island with the viewing angle other than 0 degree is not perpendicular to the display panel.

In some embodiments, a region of an image formed by a sub-pixel with a first light-emitting color in the first pixel island via the microlens corresponding to the first pixel island overlaps with a region of an image formed by a sub-pixel with a second light-emitting color in the second pixel island via the microlens corresponding to the second pixel island, wherein the first light-emitting color is different from the second light-emitting color.

In some embodiments, the plurality of pixel islands further comprise a third pixel island, wherein a region of an image formed by the first pixel island via the microlens corresponding to the first pixel island overlaps with a region of an image formed by the third pixel island via a microlens corresponding to the third pixel island, and an image formed by a pixel opening region of at least one sub-pixel in the first pixel island via the microlens corresponding to the first pixel island is between images formed by pixel opening regions of adjacent sub-pixels in the third pixel island via the microlens corresponding to the third pixel island.

In some embodiments, the first pixel island comprises a first sub-pixel, the first sub-pixel comprises a first pixel opening region, the third pixel island comprises a second sub-pixel and a third sub-pixel adjacent to the second sub-pixel, the second sub-pixel comprises a second pixel opening region, the third sub-pixel comprises a third pixel opening region, and an image formed by the first pixel opening region via the microlens corresponding to the first pixel island is between images formed by the second pixel opening region and the third pixel opening region via the microlens corresponding to the third pixel island; wherein, a distance between the image formed by the first pixel opening region via the microlens corresponding to the first pixel island and an image formed by the second pixel opening region via the microlens corresponding to the third pixel island is one-nth of a diameter or side length of each of the plurality of sub-pixels, and a diameter or side length of an opening region of each of the plurality of sub-pixels is one-nth of the diameter or side length of each of the plurality of sub-pixels, where n is a multiple of display resolution desired to be improved.

In some embodiments, a projection of each microlens in at least a part of the plurality of microlenses on the display panel at least partially overlaps with a pixel island corresponding to the each microlens.

In some embodiments, each of the plurality of pixel islands is at a focal point of the microlens corresponding to the each of the plurality of pixel islands.

In some embodiments, the plurality of sub-pixels in each of the plurality of pixel islands have a same light-emitting color.

In some embodiments, the plurality of sub-pixels in each of the plurality of pixel islands comprise a red sub-pixel, a green sub-pixel, and a blue sub-pixel.

In some embodiments, the plurality of pixel islands have a same arrangement manner of sub-pixel array.

In some embodiments, the microlens array further comprises a transparent substrate, wherein the plurality of microlenses are on a side of the transparent substrate and on the transparent substrate, and the display panel is on a side of the transparent substrate away from the plurality of microlenses.

In some embodiments, the display panel further comprises a base structure layer, wherein the plurality of pixel islands are on the base structure layer, and the plurality of pixel islands are between the base structure layer and the transparent substrate.

In some embodiments, a diameter of each of the plurality of microlenses ranges from 0.1 millimeter to 3 millimeters.

In some embodiments, axial directions of the plurality of microlenses converge in a same region, and an area of the same region is equal to an area of a pupil.

In some embodiments, a gap is provided between adjacent microlenses.

In some embodiments, the display device is a virtual reality device, an augmented reality device or a mixed reality device.

According to another aspect of embodiments of the present disclosure, a display method for a display device is provided. The display device comprises a microlens array comprising a plurality of microlenses, and a display panel comprising a plurality of pixel islands, wherein the plurality of pixel islands are arranged in one-to-one correspondence with the plurality of microlenses, each of the plurality of pixel islands comprises a plurality of sub-pixels, light emitted by the plurality of sub-pixels of each of the plurality of pixel islands enters a human eye through a microlens corresponding to the each of the plurality of pixel islands and forms an image in the human eye, and regions where images formed by at least two pixel islands in the plurality of pixel islands via microlenses corresponding to the at least two pixel islands are located are connected. The display method comprises: receiving at least two groups of sub-pixel data by the at least two pixel islands, wherein the at least two pixel islands are in one-to-one correspondence to the at least two groups of sub-pixel data; displaying at least two screens according to the at least two groups of sub-pixel data by the at least two pixel islands; and mosaicing visually the at least two screens.

In some embodiments, the plurality of pixel islands comprise a first pixel island and a second pixel island, wherein a region of an image formed by a sub-pixel with a first light-emitting color in the first pixel island via a microlens corresponding to the first pixel island overlaps with a region of an image formed by a sub-pixel with a second light-emitting color in the second pixel island via a microlens corresponding to the second pixel island, and the first light-emitting color is different from the second light-emitting color, the display method further comprising: receiving a first group of sub-pixel data by the first pixel island, and receiving a second group of sub-pixel data by the second pixel island; and displaying a first screen having the first light-emitting color according to the first group of sub-pixel data by the first pixel island, and displaying a second screen having the second light-emitting color according to the second group of sub-pixel data by the second pixel island, wherein the first screen overlaps with the second screen to adjust a screen color.

In some embodiments, the plurality of pixel islands comprise a first pixel island and a third pixel island, a region of an image formed by the first pixel island via a microlens corresponding to the first pixel island overlaps with a region of an image formed by the third pixel island via a microlens corresponding to the third pixel island, and an image formed by a pixel opening region of at least one sub-pixel in the first pixel island via the microlens corresponding to the first pixel island is between images formed by pixel opening regions of adjacent sub-pixels in the third pixel island via the microlens corresponding to the third pixel island; the display method further comprising: receiving a first group of sub-pixel data by the first pixel island, and receiving a third group of sub-pixel data by the third pixel island; and displaying a first screen according to the first group of sub-pixel data by the first pixel island, and displaying a third screen according to the third group of sub-pixel data by the third pixel island, wherein the first screen overlaps with the third screen to improve a visual resolution.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1:
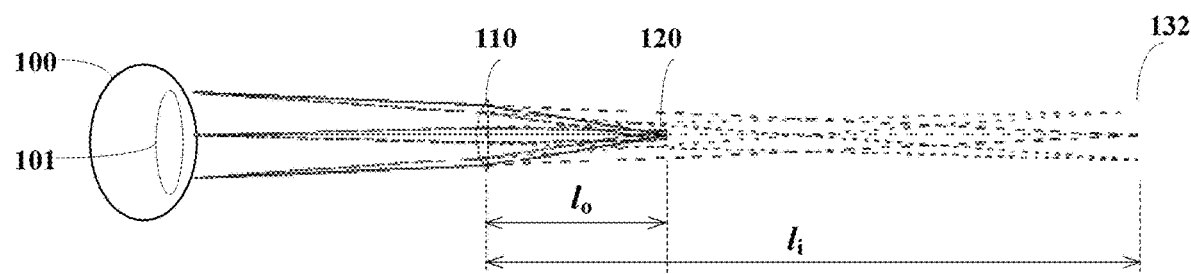
FIG. 1 is a schematic view showing a basic light path according to an embodiment of the present disclosure.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical equations, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include" or similar words means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

In a near-eye display device (for example, a VR device, an AR device, or the like) based on microlens array imaging in the related art, due to the limitations of lens imaging and the overall thickness of the device, only the pixels in an effective field-of-view of a central portion of the lens are used.

In view of this, in an embodiment of the present disclosure, a display device is provided to implement mosaicing fields-of-view of the images formed by the display device. The display device according to some embodiments of the present disclosure will be described in detail below in conjunction with the accompanying drawings.

FIG. 1 is a schematic view showing a basic light path according to an embodiment of the present disclosure.

Generally, the light path of the near-eye display device may be equivalent to the virtual image imaging light path as shown in FIG. 1. FIG. 1 shows an eye 100, a pupil 101, a lens 110, a region (the region comprising at least one sub-pixel) 120 on a panel and a virtual image 132. Here, a distance between the lens 110 and the region 120 on the panel is an object distance $l_o$, a distance between the lens 110 and the virtual image 132 is an image distance $l_i$, and a focal length of the lens 110 is f. For example, $l_o$, $l_i$ and f may all be positive values. Then, the imaging formula is:

$$\frac{1}{l_o} + \frac{1}{-l_i} = \frac{1}{f}. \tag{1}$$

Figure 2A:
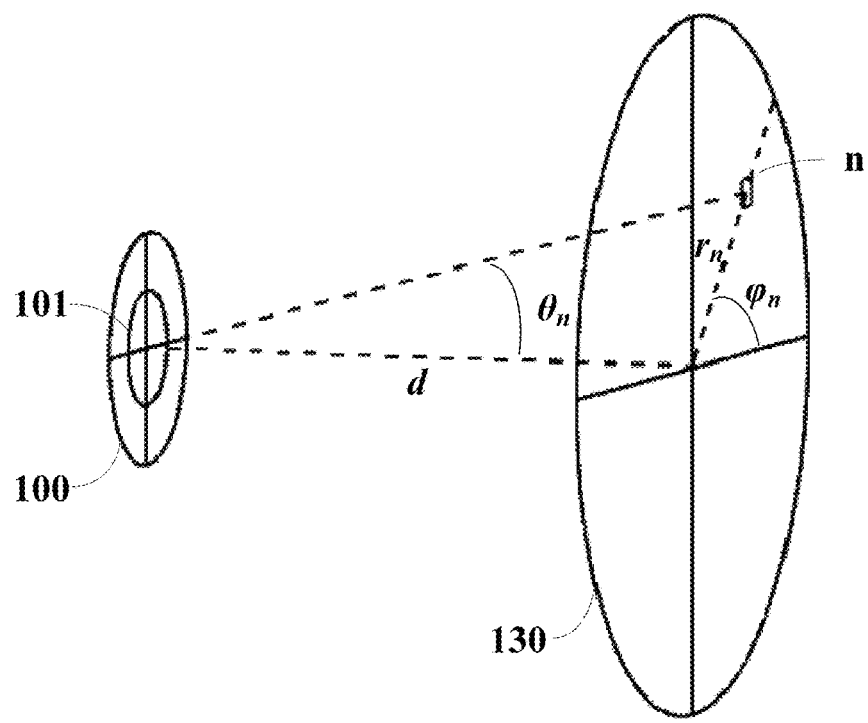
FIG. 2A is a schematic diagram showing a position of a pixel on a virtual image plane according to an embodiment of the present disclosure.
Figure 2B:
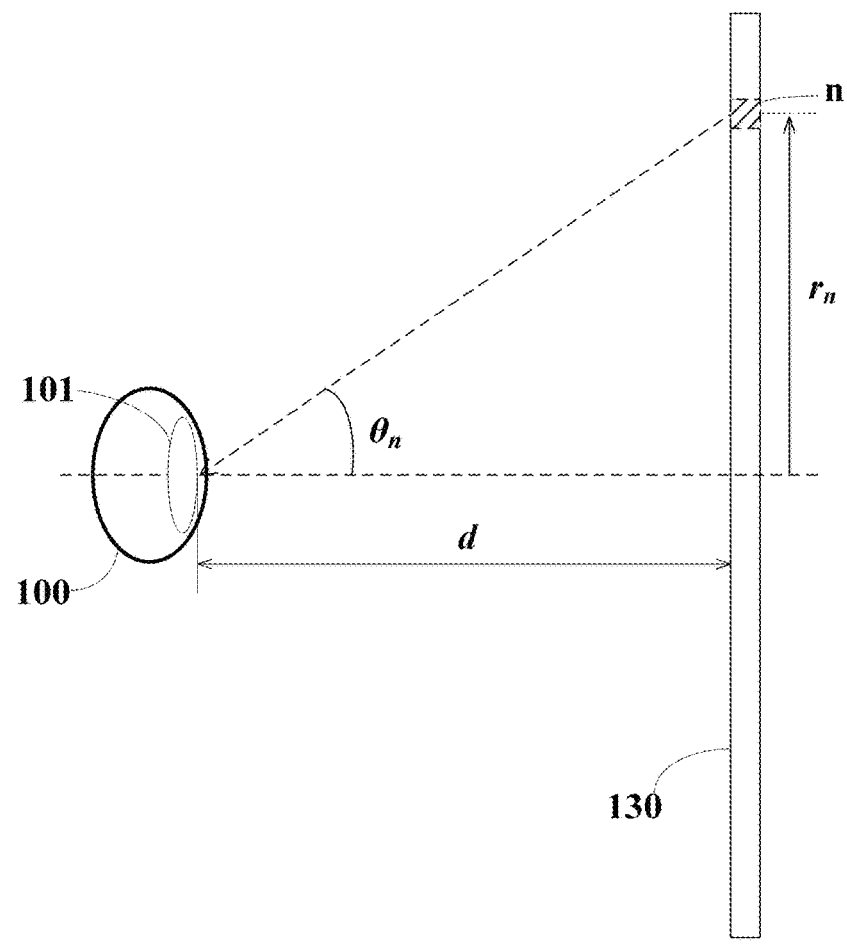
FIG. 2B is a simplified schematic view showing a position of a pixel on a virtual image plane according to another embodiment of the present disclosure.

FIG. 2A is a schematic diagram showing a position of a pixel on a virtual image plane according to an embodiment of the present disclosure. FIG. 2B is a simplified schematic view showing a position of a pixel on a virtual image plane according to another embodiment of the present disclosure.

The virtual image n of pixels at different positions on a virtual image plane 130 may be described by using the in-plane coordinates $\vec{r}_n$ (x,y) of the virtual image plane (similar to the coordinate representation of pixels in a normal plane display), and may also be described by using an azimuth angle of the virtual image center of the pixel relative to a center of the eye pupil. As shown in FIG. 2A, in general, when a virtual image distance d is fixed, a pixel at a position $\vec{r}_n$ may be described by using an azimuth angle $(\theta_n, \varphi_n)$. In some embodiments, in order to facilitate the description of the coordinates of the virtual image of the pixel, in some cases, a simplified method as shown in FIG. 2B may be used. At this time, the azimuth angle $\theta_n$ may be used to describe the pixel coordinates, while $\varphi_n$ is ignored.

Figure 3:
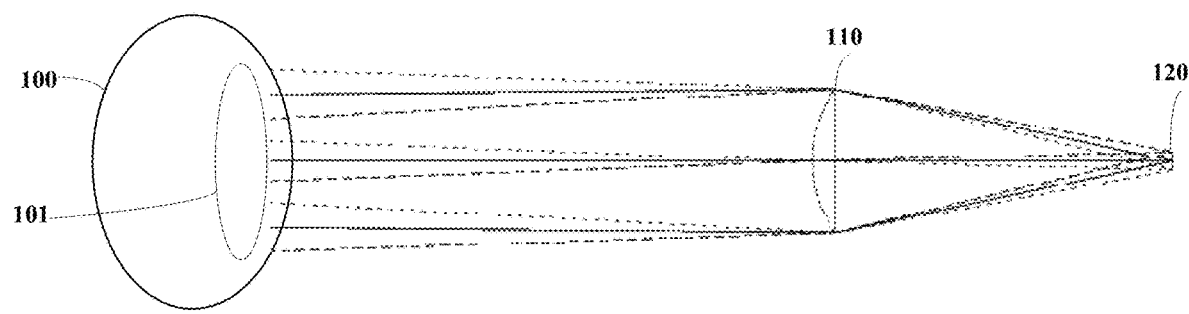
FIG. 3 is a schematic view showing a basic light path according to another embodiment of the present disclosure.

FIG. 3 is a schematic view showing a basic light path according to another embodiment of the present disclosure.

For near-eye display devices, as shown in FIG. 3, in general, the order of magnitude of the image distance may be in the order of magnitude of meters (m) (the image distance may be approximately infinite), and the order of magnitude of the object distance may be in the order of magnitude of centimeters (cm) (even the order of magnitude of millimeters (mm)), so that the image distance $l_i$ is far greater than the object distance $l_o$. Therefore, the object distance $l_o$ may be approximately equal to the focal length f of the lens according to the imaging formula (1). In this way, the light beams emitted by different pixel points (for example sub-pixels) on the panel (i.e. an object plane) after passing through the lens may be approximately regarded as parallel beams transmitted to the eye 100 at different angles, as shown in FIG. 3. That is, a plurality of light beams emitted by a single sub-pixel on the panel after passing through the lens form light beams parallel to each other, and the light beams emitted by different sub-pixels after passing through the lens may be shot into the eye at different angles.

Figure 4:
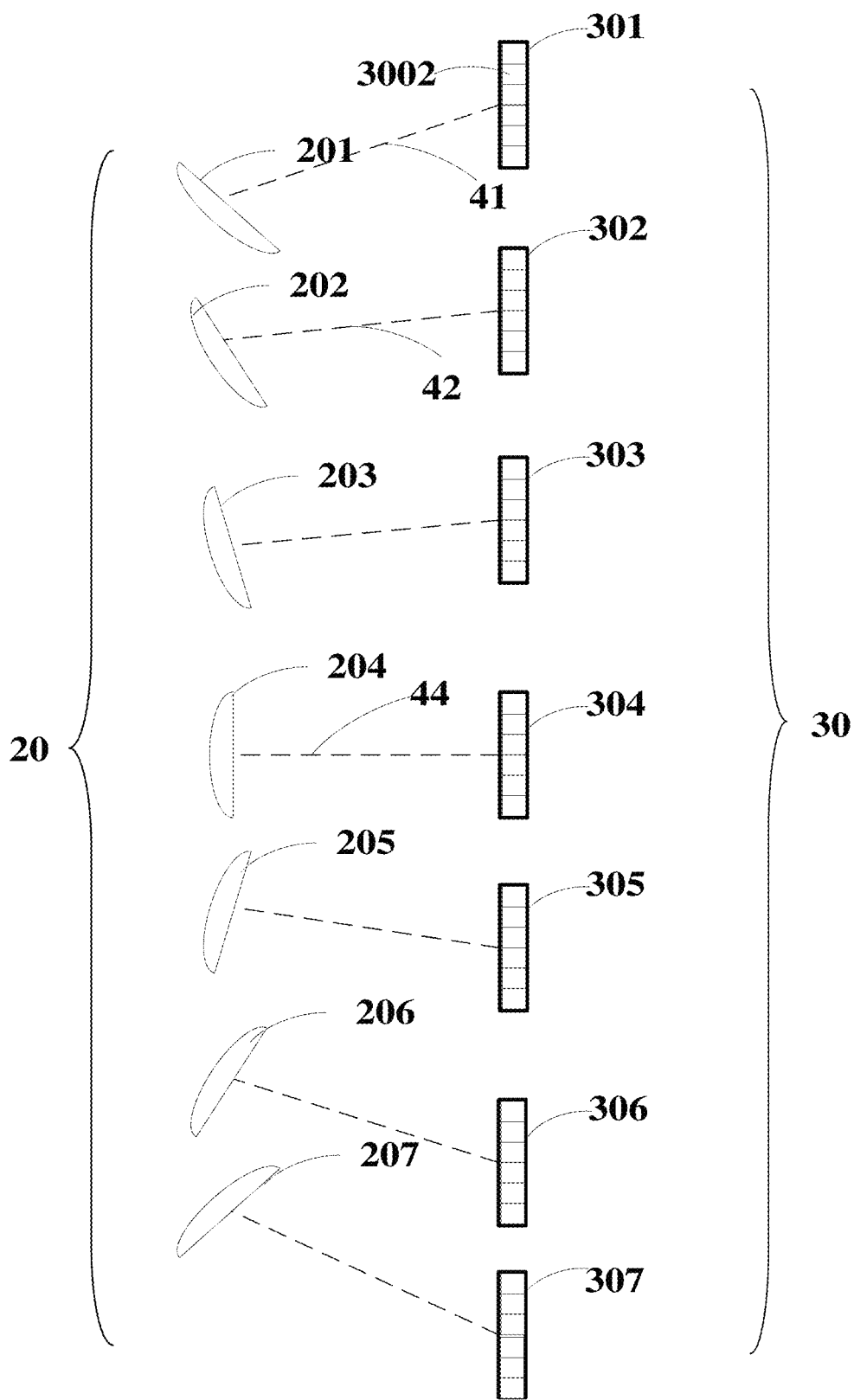
FIG. 4 is a schematic cross-sectional view showing a structure of a display device according to an embodiment of the present disclosure.

FIG. 4 is a schematic cross-sectional view showing a structure of a display device according to an embodiment of the present disclosure. For example, the display device is a virtual reality (VR) device, an augmented reality (AR) device, or a mixed reality (referred thereto as MR for short) device.

As shown in FIG. 4, the display device comprises a microlens array 20. The microlens array 20 comprises a plurality of microlenses 201 to 207. In some embodiments, a diameter of each of the plurality of microlenses ranges from 0.1 millimeter to 3 millimeters. For example, the diameter of each microlens may be 1 millimeter, 2 millimeters, or the like. The microlens may comprise: one or more of a geometric lens, a binary diffractive lens, a holographic plane lens, a meta-surface lens, or the like.

As shown in FIG. 4, the display device further comprises a display panel 30. The display panel 30 comprises a plurality of pixel islands 301 to 307. The plurality of pixel islands 301 to 307 are arranged in one-to-one correspondence with the plurality of microlenses 201 to 207. Each pixel island comprises a plurality of sub-pixels 3002. Light emitted by the plurality of sub-pixels of each pixel island enters the human eye through a microlens corresponding to the each pixel island and forms an image in the human eye. Regions where images formed by at least two pixel islands in the plurality of pixel islands via microlenses corresponding to the at least two pixel islands are located are connected. This implements mosaicing the fields-of-view of the formed image.

It should be noted that, the "connected" described here means that a boundary of a region of one image is in contact with a boundary of a region of another image, or that an angular range of one image is connected with an angular range of another image. For example, if the angular range of one image is (−1°, 1°), and the angular range of another image is (1°, 3°), then the angular ranges of the two images are connected, or the regions of the two images are connected.

It should also be noted that, the two pixel islands, regions of images formed by which are connected, may or may not be adjacent, so that the positions of the two pixel islands may not be limited. In addition, each pixel island may comprise sub-pixels with the same color or different colors.

In some embodiments, a projection of each microlens in at least a part of the plurality of microlenses on the display panel at least partially overlaps with a pixel island corresponding to the each microlens. For example, as shown in FIG. 4, a projection of each microlens on the display panel 30 at least partially overlaps with a pixel island corresponding to the each microlens.

So far, a display device according to some embodiments of the present disclosure is provided. The display device comprises a microlens array and a display panel. The microlens array comprises a plurality of microlenses. The display panel comprises a plurality of pixel islands. The plurality of pixel islands are arranged in one-to-one correspondence with the plurality of microlenses. Each pixel island comprises a plurality of sub-pixels. The light emitted by the plurality of sub-pixels of each pixel island enters the human eye through a microlens corresponding to the each pixel island and forms an image in the human eye. Regions of images formed by at least two pixel islands in the plurality of pixel islands via microlenses corresponding to the at least two pixel islands are connected, thus implementing mosaicing the fields-of-view of the display device. Moreover, the above-described embodiment uses a design of pixel island, and the size of the sub-pixels on the pixel island is no longer limited by a color filter process, which may improve the visual resolution of the image.

In some embodiments, as shown in FIG. 4, the plurality of pixel islands comprise a first pixel island 301 and a second pixel island 302. A first connection line 41 between a center of the first pixel island 301 and a center of the microlens 201 corresponding to the first pixel island is not parallel to a second connection line 42 between a center of the second pixel island 302 and a center of the microlens 202 corresponding to the second pixel island. It should be noted that, the "connection line" described here is not necessarily an actual connection line, but a virtual connection line. By way of the above-described design, it is convenient to allow the light emitted by different pixel islands to pass through respective microlenses so as to enter the same human eye for imaging.

In some embodiments, as shown in FIG. 4, each pixel island is located at a focal point of a microlens corresponding to the each pixel island. For example, the plurality of pixel islands are at a focal plane of the plurality of microlenses. The focal plane is the same plane where the focal points of the plurality of microlenses are located. The embodiment may make different lights emitted by each sub-pixel enter the eye after passing through the lens, thereby forming a virtual image in the eye. That is, each sub-pixel forms a virtual image, which facilitates mosaicing different virtual images.

It should be noted that, the distance between each microlens and a pixel island corresponding to the each microlens may be absolutely equal to a focal length of the each microlens, or may not be absolutely equal to the focal length of the each microlens. For example, the "equal to" may have a certain error (the error may be determined according to actual conditions or actual needs), just as the description of "substantially" is added before "equal to". That is, each pixel island may be located at a focal point of a microlens corresponding to the each pixel island, or at a position slightly deviated from the focal point.

In some embodiments, as shown in FIG. 4, in the plurality of pixel islands, a connection line (for example, a connection line 44) between a center of a pixel island (for example, the pixel island 304) with a viewing angle of 0 degree and a center of a microlens (for example, the microlens 204) corresponding to the pixel island with the viewing angle of 0 degree is perpendicular to the display panel 30. A connection line between a center of a pixel island with the viewing angle other than 0 degree and a center of a microlens corresponding the pixel island with the viewing angle other than 0 degree is not perpendicular to the display panel 30. Here, "the pixel island with the viewing angle of 0 degree" refers to the pixel island that the human eye faces when looking straight ahead, and "the pixel island with the viewing angle other than 0 degree" refers to other pixel islands than the pixel island with the viewing angle of 0 degree.

In some embodiments, a region of an image formed by a sub-pixel with a first light-emitting color in the first pixel island 301 via the microlens corresponding to the first pixel island overlaps with a region of an image formed by a sub-pixel with a second light-emitting color in the second pixel island 302 via the microlens corresponding to the second pixel island. The first light-emitting color is different from the second light-emitting color. This implements mosaicing the colors of images formed by the display device.

It should be noted that, in the first pixel island and the second pixel island, the colors of the sub-pixels in each pixel island may be the same or different. It should also be noted that, the first pixel island may or may not be adjacent to the second pixel island.

For example, the color of the sub-pixels in the first pixel island 301 is red, and the color of the sub-pixels in the second pixel island 302 is green. This implements the mosaicing of red and green.

In some embodiments, there may also be other pixel islands (for example, a fourth pixel island 304), wherein the fourth pixel island 304 comprises sub-pixels having a third light-emitting color. The third light-emitting color is different from the first light-emitting color and the second light-emitting color. A region of an image formed by a sub-pixel with the third light-emitting color (for example, blue) in the fourth pixel island 304 via a microlens corresponding to the fourth pixel island overlaps with the region of the image formed by the sub-pixel with the first light-emitting color in the first pixel island 301 via the microlens corresponding to the first pixel island. In this way, the first pixel island 301, the second pixel island 302, and the fourth pixel island 304 may implement the mosaicing of red, green and blue.

In some embodiments, as shown in FIG. 4, the plurality of pixel islands may further comprise a third pixel island 303. A region of an image formed by the first pixel island 301 via the microlens 201 corresponding to the first pixel island overlaps with a region of an image formed by the third pixel island 303 via a microlens 203 corresponding to the third pixel island, and an image formed by a pixel opening region (which is not shown in FIG. 4, and will be described later) of at least one sub-pixel in the first pixel island 301 via the microlens 201 corresponding to the first pixel island is between images formed by pixel opening regions of adjacent sub-pixels in the third pixel island 303 via the microlens 203 corresponding to the third pixel island. This improves the visual resolution of the display device.

In the related art, the shorter the focal length of the lens is, the greater a magnification ratio of the lens will be, which results in a lower resolution of the display device. Moreover, due to the limitation of the process accuracy (i.e., a limited resolution) of the display panel in the related art, most display devices based on microlens array imaging have low display resolution, and thus their practicability is poor. However, in the display device of the above-described embodiment of the present disclosure, since the image formed by the pixel opening region of the sub-pixel of one pixel island via the microlens are located between the images formed by the pixel opening regions of the adjacent sub-pixels of another pixel island via the microlens, thereby improving the visual resolution.

In some embodiments, the first pixel island 301 comprises a first sub-pixel. The first sub-pixel comprises a first pixel opening region. The third pixel island 303 comprises a second sub-pixel and a third sub-pixel adjacent to the second sub-pixel. The second sub-pixel comprises a second pixel opening region, and the third sub-pixel comprises a third pixel opening region. An image formed by the first pixel opening region via the microlens corresponding to the first pixel island is between images formed by the second pixel opening region and the third pixel opening region via the microlens corresponding to the third pixel island. A distance between the image formed by the first pixel opening region via the microlens corresponding to the first pixel island and an image formed by the second pixel opening region via the microlens corresponding to the third pixel island is one-nth of a diameter or side length of each sub-pixel, and a diameter or side length of an opening region of each sub-pixel is one-nth of the diameter or side length of each sub-pixel, where n is a multiple of display resolution desired to be improved. This may increase the visual resolution by n times.

In some embodiments, as shown in FIG. 4, a gap is provided between adjacent microlenses 202. For example, the microlens array may be arranged on a transparent substrate (for example, a glass substrate), and adjacent microlenses are not connected, so that there is a gap between adjacent microlenses. This may achieve a perspective effect (which will be described in detail later) by using a gap between the microlenses, which facilitates the application of the display device as an AR device.

In other embodiments, adjacent microlenses 202 may be connected. In this way, there is no gap between adjacent microlenses 202.

In some embodiments, the plurality of sub-pixels in each pixel island have the same light-emitting color. That is, each pixel island emits light of one color. For example, the sub-pixels in a certain pixel island may all emit red light, the sub-pixels in another pixel island may all emit green light, and the sub-pixels in another pixel island may all emit blue light.

In some embodiments, the plurality of sub-pixels in each pixel island comprise a red sub-pixel, a green sub-pixel, and a blue sub-pixel. For example, in each pixel island, the red sub-pixel, the green sub-pixel, and the blue sub-pixel may be arranged in an RGB (red, green, blue) arrangement manner. In this way, the image displayed by each pixel island itself is a chromatic image instead of a monochromatic image.

Therefore, compared with the structure shown in FIG. 3, the structure of the display device of the embodiments of the present disclosure may make an aperture of the microlens smaller. From the perspective of lens design, the focal length of the microlens may be reduced accordingly, so that the device may be lighter and thinner. In addition, the same virtual image point seen by the eye may be jointly synthesized by different sub-pixels in different pixel islands under different microlenses, which cannot be achieved in a traditional single-lens and single-panel structure. In this way, different color components (for example, red, green, and blue) of the same virtual image point seen by the eye may be placed on different pixel islands under different microlenses. In this way, for a single pixel island (for example, comprising N×M sub-pixels), the reduction or limitation of color on the resolution of the panel is eliminated. This is because a plurality of sub-pixels of three colors may occupy more space than a plurality of sub-pixels of a single color, and in technologies such as evaporation of OLED (Organic Light Emitting Diode), the color realization may also be limited by the process. Furthermore, different components of the same virtual image point seen by the eye are respectively placed on different pixel islands under different microlenses, and the position of the pixel opening region is appropriately fine adjusted, so that the same virtual image points that originally overlap are staggered by an appropriate distance. By adjusting a staggered distance and arrangement manner of these virtual image points, the number of equivalent pixels on the virtual image surface may be increased, that is, the resolution is improved.

Figure 5:
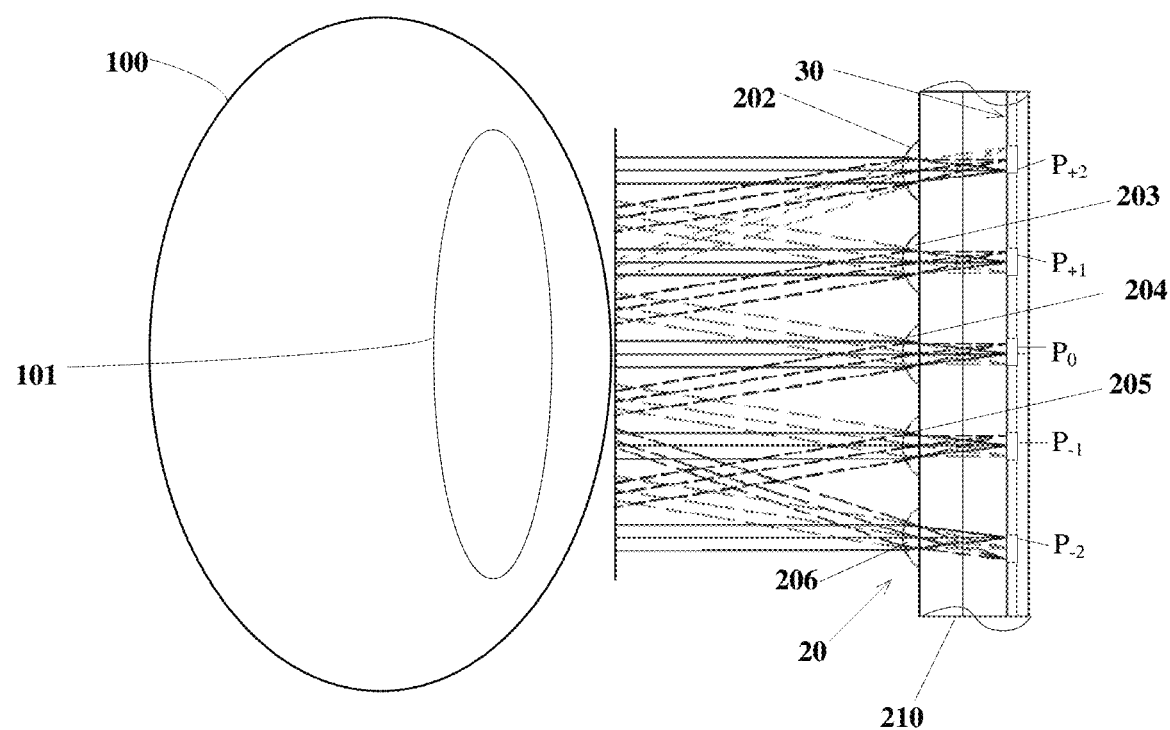
FIG. 5 is a schematic view showing a mosaicing principle based on a microlens array and a pixel island according to an embodiment.

FIG. 5 is a schematic view showing a mosaicing principle based on a microlens array and a pixel island according to an embodiment.

In FIG. 5, the eye 100, the pupil 101, the microlens array 20, and the display panel 30 are shown. The microlens array comprises a transparent substrate 210 and a plurality of microlenses 202 to 206 on the transparent substrate 210. For example, the transparent substrate 210 may have a single-layer structure or a multilayer structure. The display panel 30 may comprise a plurality of pixel islands $P_{+2}$, $P_{+1}$, $P_0$, $P_{-1}$, and $P_{-2}$. Assume that corresponding sub-pixels of different pixel islands may all generate a beam of light at a certain angle (for example, θ and φ in the coordinates (θ,φ) of the sub-pixels are both) 0°, and these lights produce the same virtual image points that overlap (for example, the virtual image points at infinity corresponding to the 0° field-of-view) after entering the pupil of the eye, so that the image seen at this time is an image without an improved resolution. Here, a combination of sub-pixels in a pixel island that generate light beam of a same angle and the microlens may be equivalent to a combination of a certain corresponding sub-pixel that generates an entire beam of light of a certain angle as shown in FIG. 3 and a single (large) lens. Further, in the embodiments of the present disclosure, the pixel opening regions of corresponding sub-pixels of different pixel islands may be misaligned, so that the virtual image points generated by the corresponding sub-pixels do not overlap, thereby improving the resolution of the displayed image.

Figure 6A:
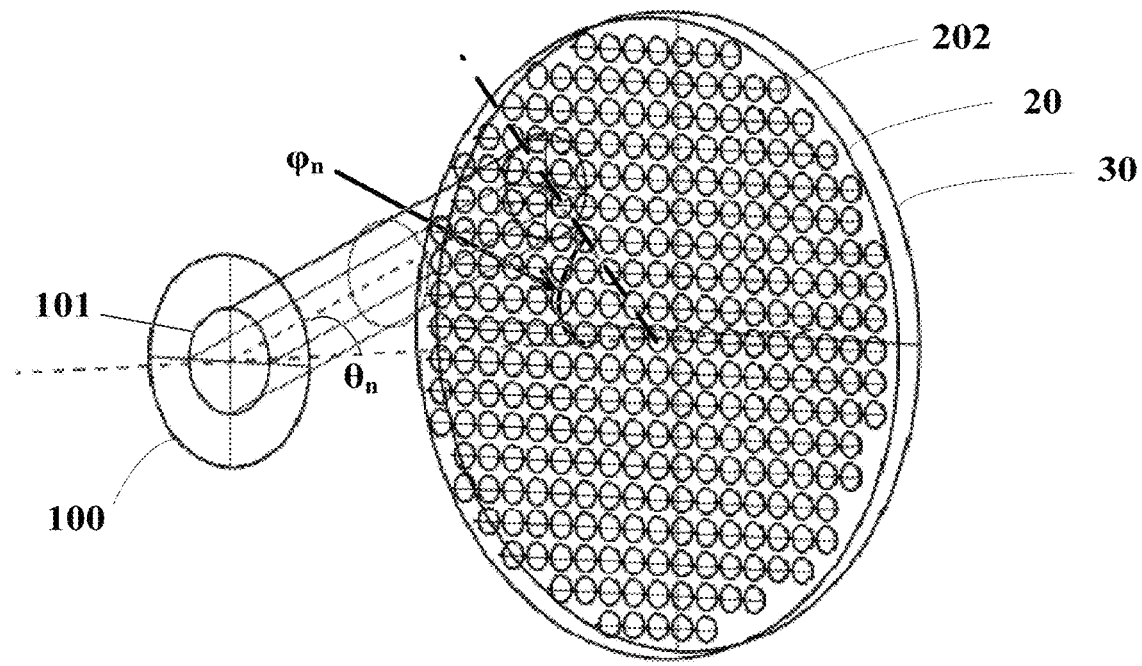
FIG. 6A is a perspective schematic view showing a structure of a display device according to an embodiment of the present disclosure.
Figure 6B:
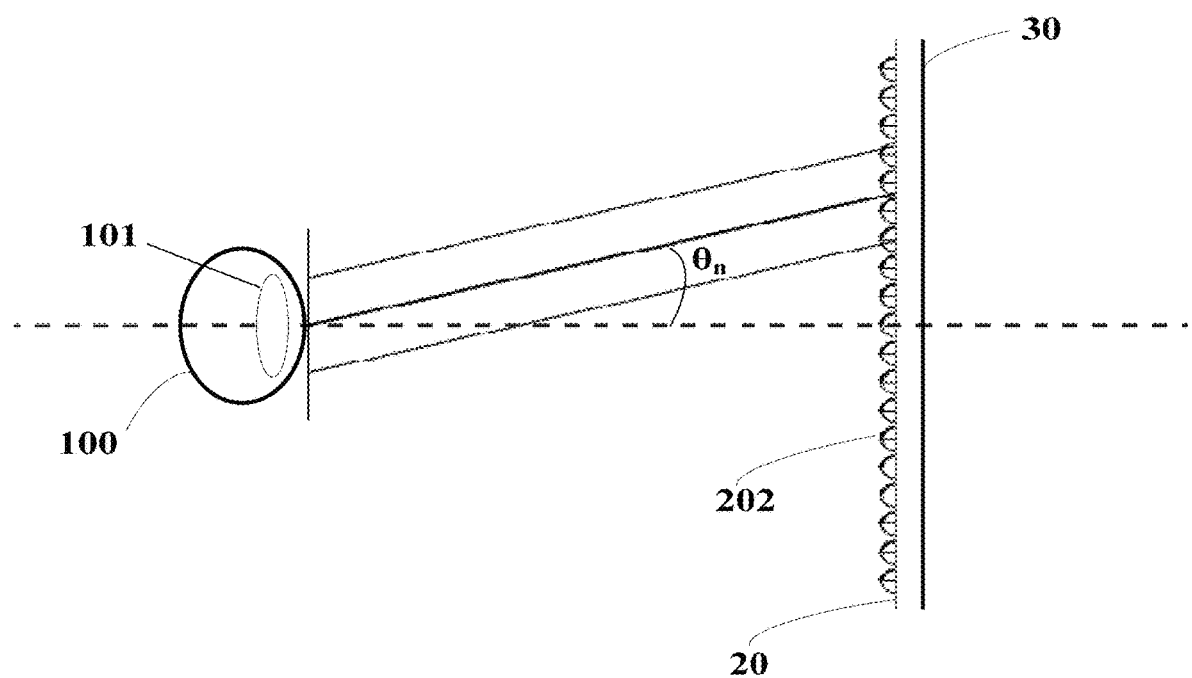
FIG. 6B is a schematic cross-sectional view showing a structure of a display device according to an embodiment of the present disclosure.

FIG. 6A is a perspective schematic view showing a structure of a display device according to an embodiment of the present disclosure. FIG. 6B is a schematic cross-sectional view showing a structure of a display device according to an embodiment of the present disclosure.

In the schematic structural views of the display device shown in FIGS. 6A and 6B, within the designed field-of-view range, any field-of-view may need to meet: for the case where the displayed image is a monochromic image or the case where the RGB (red, green, and blue) three-color sub-pixels are arranged on the same pixel island, the cylinder shown in FIG. 6A corresponding to a corresponding exit pupil diameter of the pupil 101 has at least one microlens on average; or, for the case where the RGB three-color sub-pixels are in different pixel islands, the cylinder as shown in the drawings may have at least three microlenses on average (so that it is possible to implement mosaicing the colors of the displayed image). In this way, by way of the imaging effect of the microlens array, the sub-images displayed on different pixel islands are image mosaicked to form a complete screen in the field-of-view of the human eye. That is, field-of-view mosaicing is implemented.

Since the pupil of the eye is approximately 3 millimeters in the daytime, the diameter of the microlens may be made to be less than or equal to 3 millimeters, so that the cylinder has at least one microlens on average as much as possible. For example, the diameter of the microlens ranges from 0.1 millimeter to 3 millimeters.

According to the principle of mosaic display based on the microlens array and the pixel islands as described above, by way of the misalignment of pixel opening regions of corresponding sub-pixels under the microlens, a display viewing angle that cannot be achieved by a combination of a single microlens and a pixel island may be achieved, thereby implementing improving an equivalent display resolution on the virtual image surface by mosaicing.

In the schematic structural views of the display device shown in FIGS. 6A and 6B, within the designed field-of-view range, any field-of-view may need to meet: for the case where the displayed image is a monochromic image or the RGB three-color sub-pixels are arranged in the same pixel island, the cylinder shown in FIG. 6A corresponding to an exit pupil diameter corresponding to the pupil 101 has at least N×M microlenses on average, wherein in the microlens array, there are N microlenses in one direction, and there are M microlenses in the other direction, where N and M are both positive integers; or, for the case where the RGB three-color sub-pixels are in different pixel islands, the cylinder may have at least 3×N×M microlenses on average, which may finally achieve a resolution increase of N×M times.

In some embodiments, the principle of mosaicing display based on the microlens array and the pixel islands may also be expanded to the implementation of color mosaicing. That is, the colors of equivalent sub-pixels under different microlenses in the same field-of-view may be used as different color components for realizing white pixels. The color rendering is implemented by combining images of different colors of sub-pixels on the virtual image plane. This method may reduce the limitation of the manufacturing process (for example, the FMM (Fine Metal Mask) process) in the related art on the resolution of the OLED panel, and achieve the improvement of the resolution of the OLED panel.

Those skilled in the art can understand that, for non-OLED display panels, such as LCD (Liquid Crystal Display) and the like, the resolution of the display can also be significantly improved by arranging the equivalent microlenses to correspond to the pixel islands of different colors.

Figure 7A:
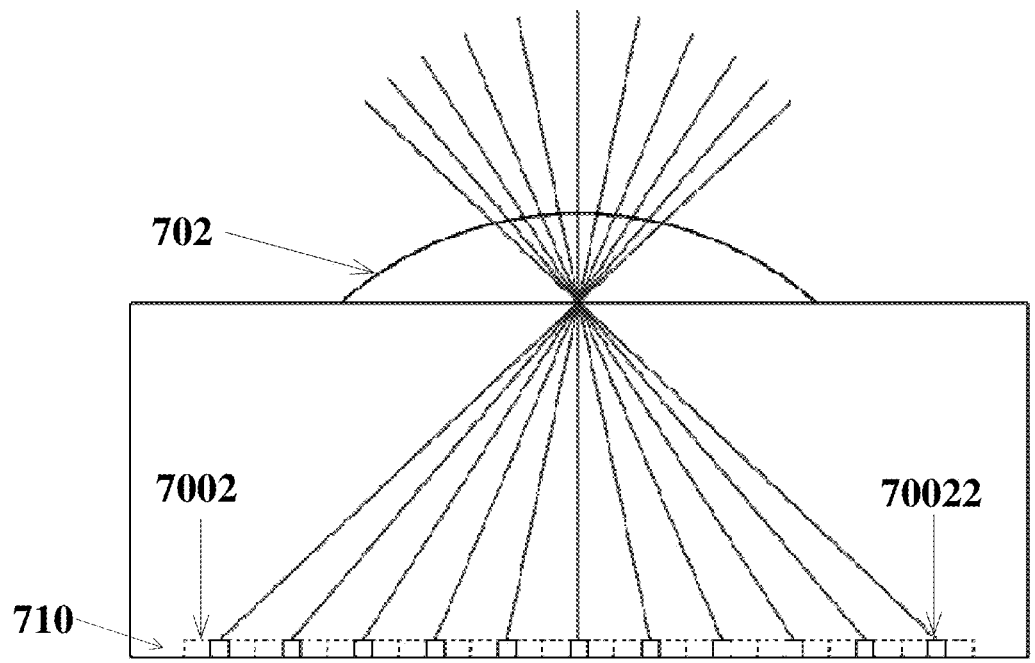
FIG. 7A is a schematic cross-sectional view showing structures of a microlens and a pixel island according to an embodiment of the present disclosure.

FIG. 7A is a schematic cross-sectional view showing structures of a microlens and a pixel island according to an embodiment of the present disclosure.

As shown in FIG. 7A, a pixel island 710 comprises a plurality of sub-pixels 7002. In the pixel island 710, a pixel opening region 70022 of each sub-pixel 7002 is at a center position of the sub-pixel. The light emitted from the pixel opening region of each sub-pixel enters a pupil of an eye (not shown in FIG. 7A) through a microlens 702.

Figure 7B:
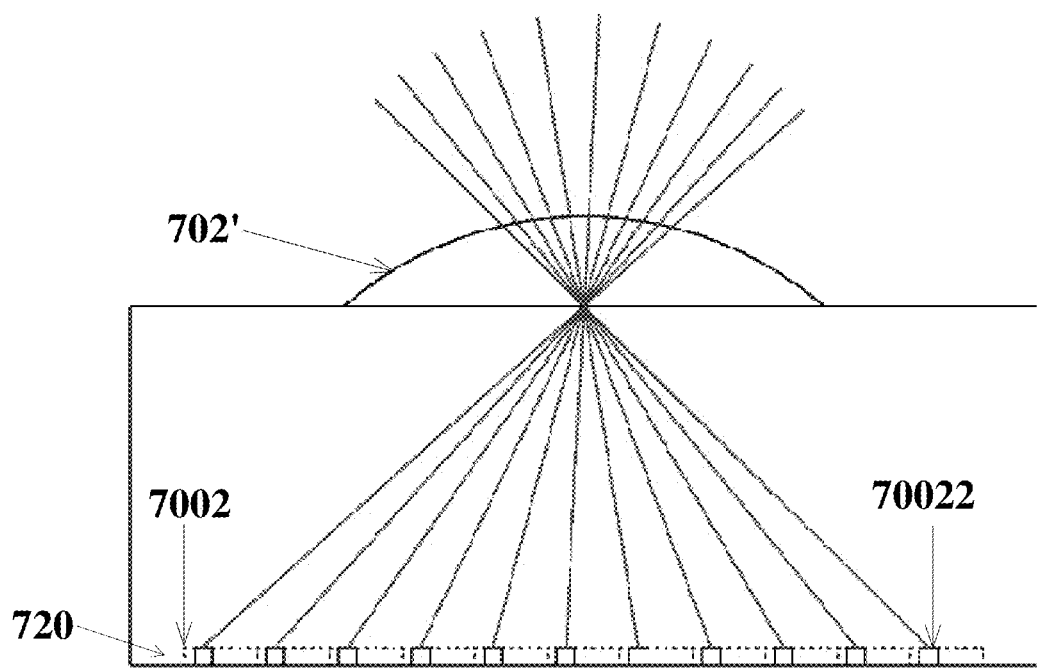
FIG. 7B is a schematic cross-sectional view showing structures of a microlens and a pixel island according to another embodiment of the present disclosure.

FIG. 7B is a schematic cross-sectional view showing structures of a microlens and a pixel island according to another embodiment of the present disclosure.

As shown in FIG. 7B, a pixel island 720 comprises a plurality of sub-pixels 7002. In the pixel island 720, a pixel opening region 70022 of each sub-pixel 7002 is at a position deviated from a center of the sub-pixel. For example, as shown in FIG. 7B, in each sub-pixel, the pixel opening region 70022 is on a left side of the center of the sub-pixel. The light emitted from the pixel opening region of each sub-pixel enters a pupil of an eye (not shown in FIG. 7B) through a microlens 702'.

Figure 7C:
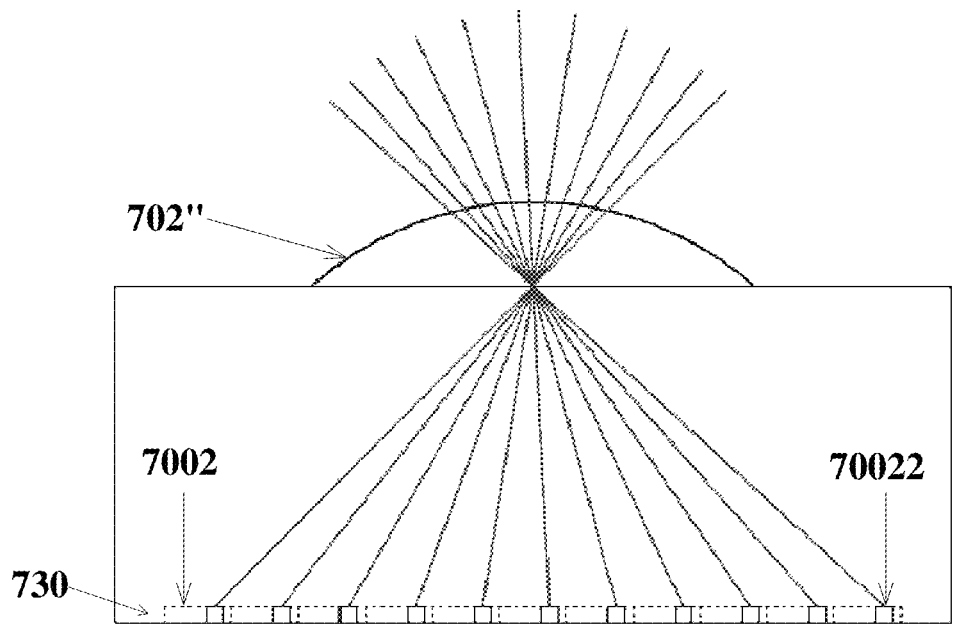
FIG. 7C is a schematic cross-sectional view showing structures of a microlens and a pixel island according to another embodiment of the present disclosure.

FIG. 7C is a schematic cross-sectional view showing structures of a microlens and a pixel island according to another embodiment of the present disclosure.

As shown in FIG. 7C, a pixel island 730 comprises a plurality of sub-pixels 7002. In the pixel island 730, a pixel opening region 70022 of each sub-pixel 7002 is at a position deviated from a center of the sub-pixel. For example, as shown in FIG. 7C, in each sub-pixel, the pixel opening region 70022 is on a right side of the center of the sub-pixel. The light emitted from the pixel opening region of each sub-pixel enters the pupil of the eye (not shown in FIG. 7C) through a microlens 702".

According to the principle of mosaicing display based on the microlens array and the pixel islands as described above, the images formed by the pixel opening region of corresponding sub-pixels under different microlenses are misaligned (as shown in FIGS. 7A, 7B and 7C), thereby achieving the improvement of an equivalent display resolution on the virtual image surface by way of image mosaicing during display.

In some embodiments, the plurality of pixel islands have the same arrangement manner of sub-pixel array. For example, the arrangement manner of sub-pixel array may comprise an arrangement shape of the sub-pixel array and a shape of the sub-pixel.

Figure 8:
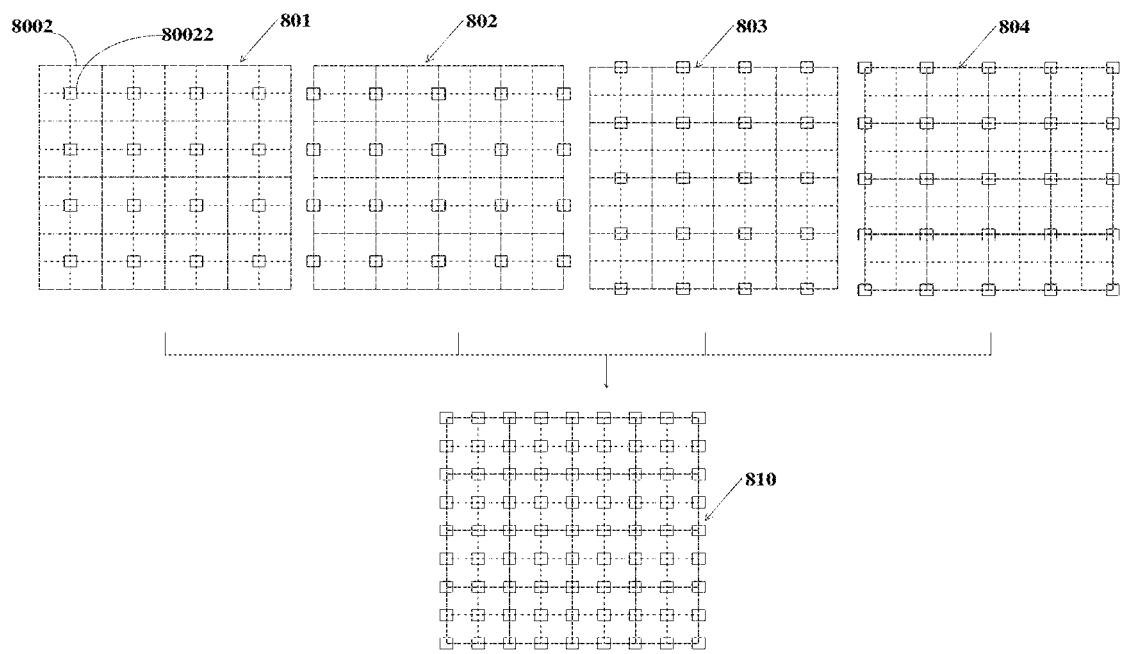
FIG. 8 is a schematic view showing an arrangement of a sub-pixel array of a pixel island according to an embodiment of the present disclosure.

FIG. 8 is a schematic view showing an arrangement of a sub-pixel array of a pixel island according to an embodiment of the present disclosure.

In some embodiments, as shown in FIG. 8, the display panel comprises four pixel islands 801, 802, 803 and 804. Each pixel island comprises a plurality of sub-pixels 8002. Each sub-pixel 8002 comprises a pixel opening region 80022. The arrangement manner of sub-pixel array of each pixel island shown in FIG. 8 may be referred to as a square arrangement manner.

As shown in FIG. 8, the pixel opening region of each sub-pixel 8002 of the first pixel island 801 is at a center position of the sub-pixel. The pixel opening region of each sub-pixel 8002 of the second pixel island 802 is at a center position of a boundary of each sub-pixel. The pixel opening region of each sub-pixel 8002 of the third pixel island 803 is at a center position of other boundaries of each sub-pixel. The pixel opening region of each sub-pixel 8002 of the fourth pixel island 804 is at an apex angle position of each sub-pixel.

In this way, when the four pixel islands 801 to 804 are used to display an image, each pixel island may form an image, so that four images formed by four pixel islands may be mosaicked to form an image 810 as shown in FIG. 8. For example, the image 810 is an image on a virtual image plane. It may be seen from FIG. 8 that, the resolution of the image 810 is significantly greater than the resolution of the image displayed by each pixel island. Therefore, the display device of the embodiments of the present disclosure may improve the visual resolution of the image.

Figure 9:
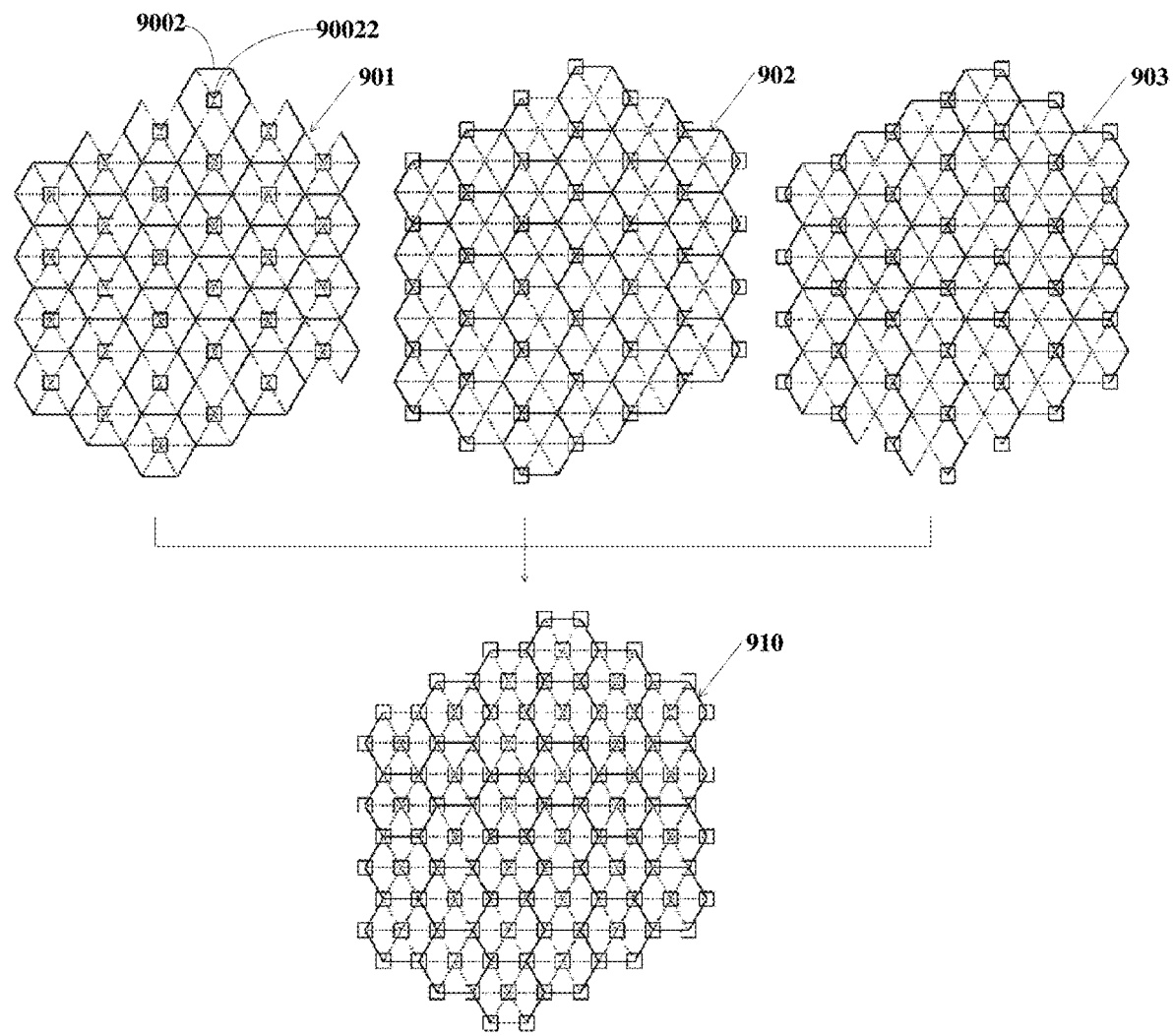
FIG. 9 is a schematic view showing an arrangement of a sub-pixel array of a pixel island according to another embodiment of the present disclosure.

FIG. 9 is a schematic view showing an arrangement of a sub-pixel array of a pixel island according to another embodiment of the present disclosure.

In some embodiments, as shown in FIG. 9, the display panel comprises three pixel islands 901, 902 and 903. Each pixel island comprises a plurality of sub-pixels 9002. Each sub-pixel 9002 comprises a pixel opening region 90022. The arrangement manner of sub-pixel array of each pixel island shown in FIG. 9 may be referred to as a hexagonal arrangement manner.

As shown in FIG. 9, the pixel opening region 90022 of each sub-pixel 9002 of the first pixel island 901 is at a center position of the sub-pixel. The pixel opening region 90022 of each sub-pixel 9002 of the second pixel island 902 is at one apex angle position of the sub-pixel. The pixel opening region 90022 of each sub-pixel 9002 of the third pixel island 903 is at another apex angle position of the sub-pixel. Here, a connection line between the one apex angle position and the center position of the sub-pixel forms an angle of 120° with a connection line between the another apex angle position and the center position of the sub-pixel.

In this way, when the three pixel islands 901 to 903 are used to display an image, each pixel island may form an image, so that three images formed by the three pixel islands may be mosaicked to form an image 910 as shown in FIG. 9. For example, the image 910 is an image on a virtual image plane. It may be seen from FIG. 9 that, the resolution of the image 910 is significantly greater than the resolution of the image displayed by each pixel island. Therefore, the display device of the embodiments of the present disclosure may improve the visual resolution of the image.

It may be seen from FIGS. 8 and 9 that, the region of the image formed by one pixel island (for example, the first pixel island) via a microlens corresponding to the one pixel island overlaps with the region of the image formed by another pixel island (for example, the third pixel island) via a microlens corresponding to the another pixel island, and the image formed by the pixel opening region of at least one sub-pixel in the one pixel island via the microlens corresponding to the one pixel island is between the images formed by the pixel opening regions of adjacent sub-pixels in the another pixel island via the microlens corresponding to the another pixel island. In this way, the visual resolution of the display device can be improved.

In general, a visual uniformity and an equivalent resolution of the hexagonal arrangement manner of the sub-pixel array are greater than a visual uniformity and an equivalent resolution of the square arrangement manner of the sub-pixels. In addition, the hexagonal arrangement manner is also likely to achieve seamless mosaicing of the fields-of-view between the pixel islands.

It should be noted that, the above-described square arrangement manner and hexagonal arrangement manner of the sub-pixel array are only exemplary, and other arrangement manners may also be used in the embodiments of the present disclosure. Therefore, the scope of the embodiments of the present disclosure is not limited thereto.

In some embodiments, the arrangement manner of the microlens array is consistent with the arrangement manner of the pixel island. The arrangement manner of the sub-pixel array may be consistent or inconsistent with the arrangement manner of the pixel island.

Figure 10:
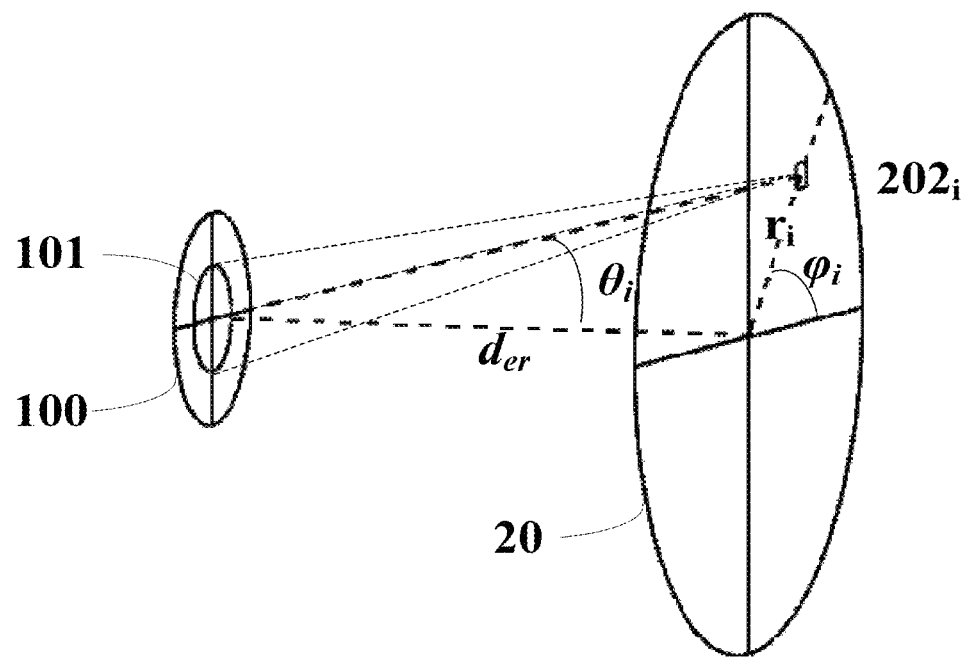
FIG. 10 is a schematic view showing a coordinate representation of a microlens according to an embodiment of the present disclosure.

FIG. 10 is a schematic view showing a coordinate representation of a microlens according to an embodiment of the present disclosure.

In FIG. 10, the eye 100, the pupil 101, the microlens array 20, and a certain microlens $202_i$ in the microlens array 20 are shown. $\theta_i$ is an angle formed by a connection line between a center of the microlens $202_i$ and a center of the pupil 101 and the overall optical axis of the microlens array 20, $\varphi_i$ is an angle formed by a connection line between the center of the microlens $202_i$ and a center of the microlens array and an axis direction within the plane where the microlens array is located (for example, the axis may be the x-axis, which for example may be the horizontal direction), $r_i$ is a length of the connection line between the center of the microlens $202_i$ and the center of the microlens array, and $d_{er}$ is a distance between the center of the microlens array and the center of the pupil. In order to meet the mosaicing of the fields-of-view, the light exit angle of the single microlens $202_i$ is required to be within a cone range as shown in FIG. 10 (i.e., the cone formed by the connection lines between the center of the microlens and an edge of the pupil). Here is the following relation:

$$r_i = d_{er} * \tan(\theta_i) \qquad (2)$$

Figure 11A:
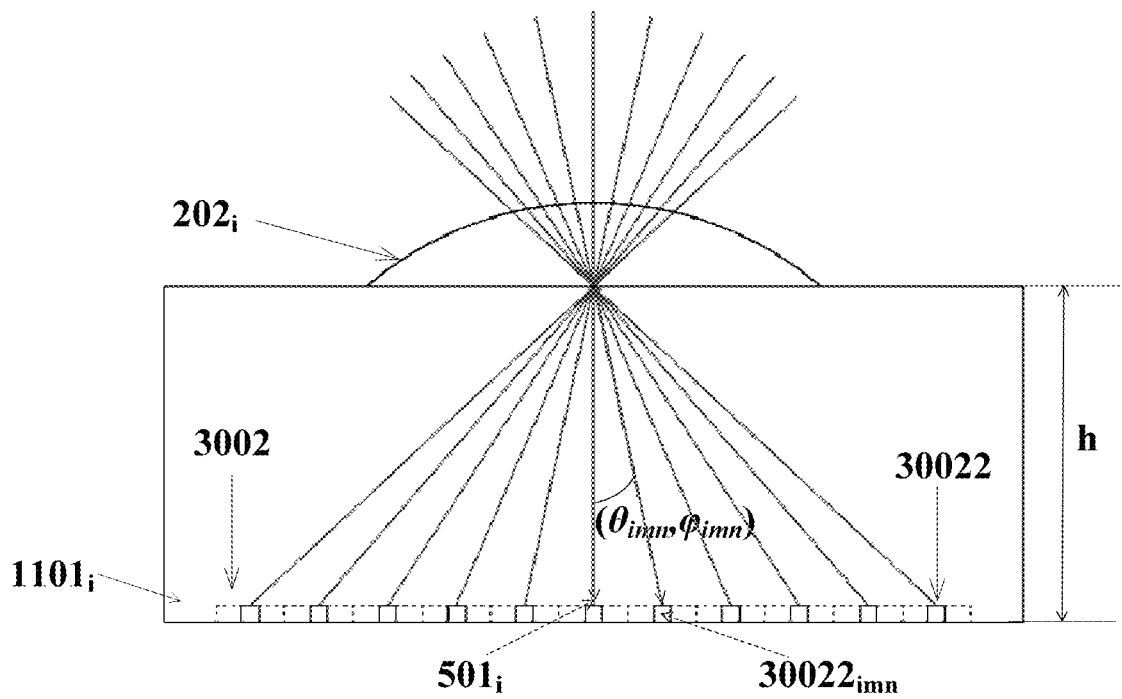
FIG. 11A is a schematic view showing a coordinate representation of a pixel opening region of a sub-pixel according to an embodiment of the present disclosure.

FIG. 11A is a schematic view showing a coordinate representation of a pixel opening region of a sub-pixel according to an embodiment of the present disclosure.

As shown in FIG. 11A, in the field-of-view cone range corresponding to the microlens $202_i$, during the process of imaging the corresponding pixel islands, an M×N sub-pixel array with an angle of $(\theta_{imn}, \varphi_{imn})$ is required to be formed, where $(\theta_{imn}, \varphi_{imn})$ are angular coordinates of the pixel opening region of the sub-pixel. Here, m=1, 2, 3 . . . , M, n=1, 2, 3, . . . , N, and M and N are positive integers. Here, $\theta_{imn}$ is an angle formed by a connection line between a center of the pixel opening region $30022_{imn}$ of a certain sub-pixel of the pixel island $1101_i$ and a center of the microlens $202_i$ and a line perpendicular to the pixel island $1101_i$ and passing through the center of the microlens, $\varphi_{imn}$ is an angle formed by a connection line between the center of the pixel opening region of the sub-pixel of the pixel island $1101_i$ and a center of the pixel island and the coordinate axis direction within the plane where the pixel island $1101_i$ is located (for example, the coordinate axis may be defined as the x axis within the plane where the pixel island is located, which may be, for example, the horizontal direction). As shown in FIG. 11A, the coordinates of a position $501_i$ on the pixel island panel corresponding to the center of the microlens (the position $501_i$ is an orthographic projection of the center of the microlens on the plane where the corresponding pixel island is located) are $(r_i \cos(\varphi_i), r_i \sin(\varphi_i))$, and at this time $\theta_i$ is 0°. Since the center of the microlens is directly above the position $501_i$ (as shown in FIG. 11A), it may be considered that the coordinates of the position $501_i$ are the same as the coordinates of the center of the microlens. The coordinates of any pixel opening region $30022_{imn}$ are $(r_i \cos(\varphi_i) + h^*\tan(\theta^{imn})^*\cos(\varphi_{imn}), r_i \sin(\varphi_i) + h^*\tan(\theta_{imn})^*\sin(\theta_{imn}))$ (3), where h is a vertical distance between the microlens and the pixel island. In some embodiments, the angular array $(\theta_{imn}, \varphi_{imn})$ may be provided to be a linearly distributed array, or its corresponding position array (as shown by the above-described coordinates (3)) may also be provided to be a linearly distributed array.

Figure 11B:
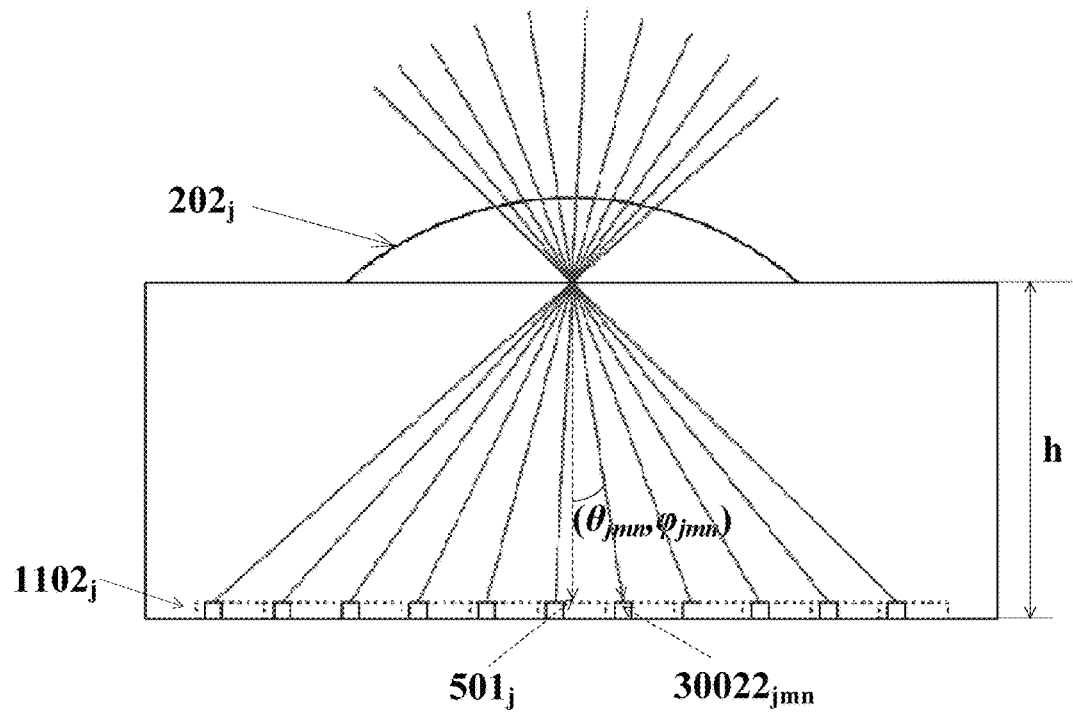
FIG. 11B is a schematic view showing a coordinate representation of a pixel opening region of a sub-pixel according to another embodiment of the present disclosure.

FIG. 11B is a schematic view showing a coordinate representation of a pixel opening region of a sub-pixel according to another embodiment of the present disclosure.

As shown in FIG. 11B, during the process of imaging the corresponding pixel island, an M×N sub-pixel array with an angle of $(\theta_{jmn}, \varphi_{jmn})$ is required to be formed, where $(\theta_{jmn}, \varphi_{jmn})$ are angular coordinates of the pixel opening region of the sub-pixel. Here, m=1, 2, 3 . . . , M, n=1, 2, 3, . . . , N, and M and N are positive integers. Here, $\theta_{jmn}$ is an angle formed by a connection line between a center of the pixel opening region $30022_{jmn}$ of a certain sub-pixel of the pixel island $1102_j$ and a center of the microlens $202_j$ and a line perpendicular to the pixel island $1102_j$ and passing through the center of the microlens, $\theta_{jmn}$ is an angle between the connection line between a center of the pixel opening region of the sub-pixel of the pixel island $1102_j$ and a center of the pixel island and the coordinate axis direction within the plane where the pixel island $1102_j$ is located (for example, the coordinate axis may be defined as the x-axis within the plane where the pixel island is located, which may be, for example, the horizontal direction). As shown in FIG. 11B, the coordinates of a position $501_j$ on the pixel island panel corresponding to the center of the microlens (the position $501_j$ is an orthographic projection of the center of the microlens on the plane where the corresponding pixel island is located) are $(r_j \cos(\varphi_j), r_j \sin(\varphi_j))$, where $\varphi_j$ is an angle formed by a connection line between the center of the microlens $202_j$ and a center of the microlens array and a coordinate axis direction within the plane where the microlens array is located (for example, the coordinate axis may be the x-axis, which may be, for example, the horizontal direction), $r_j$ is a length of the connection line between the center of the microlens $202_j$ and the center of the microlens array, and $\theta_j$ is an angle formed by a connection line between the center of the microlens $202_j$ and a center of the pupil and the overall optical axis of the microlens array, and is assumed to be 0° here. Since the center of the microlens is directly above the position $501_j$ (as shown in FIG. 11B), it may be considered that the coordinates of the position $501_j$ are the same as the coordinates of the center of the microlens. The coordinates of any pixel opening region $30022_{jmn}$ are $(r_j \cos(\varphi_j) + h^*\tan(\theta_{jmn})^*\cos(\varphi_{jmn}), r_j \sin(\varphi_j) + h^*\tan(\theta_{jmn})^*\sin(\varphi_{jmn}))$ (4), where h is a vertical distance between the microlens and the pixel island. In some embodiments, the angular array $(\theta_{jmn}, \varphi_{jmn})$ may be provided to be a linearly distributed array, or its corresponding position array (as shown by the above-described coordinates (4)) may also be provided to be a linearly distributed array.

In some embodiments, the offset of the pixel opening region of a corresponding sub-pixel may be obtained according to the coordinates (4) and the coordinates (3). For example, in the horizontal direction (for example, the x direction of the xy coordinate system), the offset of the pixel opening region $30022_{jmn}$ of the sub-pixel relative to $30022_{imn}$ is $r_j \cos(\varphi_j) + h^*\tan(\theta_{jmn})^*\cos(\varphi_{jmn}) - r_i \cos(\varphi_i) - h^*\tan(\theta_{imn})^*\cos(\varphi_{imn})$, and in the vertical direction (for example, the y direction of the xy coordinate system), the offset of the pixel opening region $30022_{jmn}$ of the sub-pixel relative to $30022_{imn}$ is $r_j \sin(\varphi_j) + h^*\tan(\theta_{jmn})^*\sin(\varphi_{jmn}) - r_i \sin(\varphi_i) - h^*\tan(\theta_{imn})^*\sin(\varphi_{imn})$.

In some embodiments, when the field-of-view mosaicing of the microlens $202_i$ and the microlens $202$ are required to be achieved, the boundary of the virtual image of the pixel opening region $(\theta_{imn}, \varphi_{imn})$ of the sub-pixel may be connected with the boundary of the virtual image of the pixel opening region $(\theta_{jmn}, \varphi_{jmn})$ of the sub-pixel. In this case, the position of the pixel opening region of other sub-pixels may be obtained by combining the coordinate formulas (3) and (4) described above, so that the position of the pixel island corresponding to the microlens $202_i$ and the position of the pixel island corresponding to the microlens $202_j$ may be obtained.

In some embodiments, when it is necessary to implement color mosaicing of the formed virtual images respectively corresponding to the microlens $202_i$ and the microlens $202_j$, the image of the pixel opening region $(\theta_{imn}, \varphi_{imn})$ of the sub-pixel may overlap with the image of the pixel opening region $(\theta_{jmn}, \varphi_{jmn})$ of the sub-pixel. In other embodiments, the color mosaicing of the virtual image can also be achieved by making the virtual image of the pixel opening region $(\theta_{imn}, \varphi_{imn})$ of the sub-pixel close to the virtual image of the pixel opening region $(\theta_{jmn}, \varphi_{jmn})$ of the sub-pixel.

In some embodiments, the virtual image of the pixel opening region $(\theta_{imn}, \varphi_{imn})$ of the sub-pixel may be misaligned with the virtual image of the pixel opening region $(\theta_{jmn}, \varphi_{jmn})$ of the sub-pixel, so as to achieve the improvement of the resolution of the formed virtual images respectively corresponding to the microlens $202_i$ and the microlens $202_j$. For example, the gaps between the virtual images of adjacent sub-pixels of a certain pixel island are filled with the virtual images of the sub-pixels of other pixel islands, so as to achieve the improvement of the visual resolution when the image is displayed. In some embodiments, in the angular space of the sub-pixels, the distance between adjacent sub-pixels may be equal, which may improve the display effect.

Figure 12A:
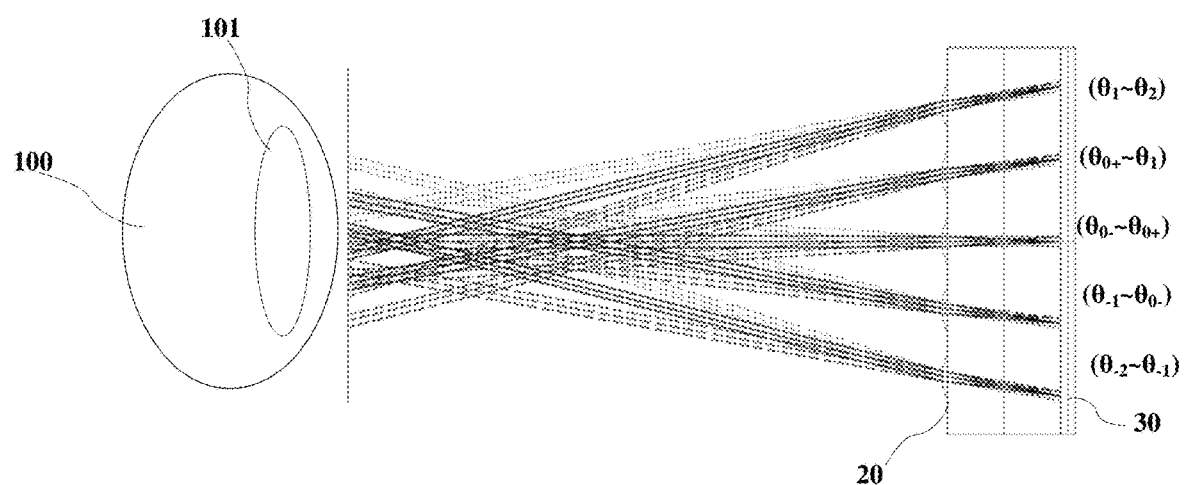
FIG. 12A is a schematic view showing a principle of field-of-view mosaicing of a display device according to an embodiment of the present disclosure.

FIG. 12A is a schematic view showing a principle of field-of-view mosaicing of a display device according to an embodiment of the present disclosure. FIG. 12A shows the microlens array 20, the display panel 30, the eye 100, and the pupil 101.

As shown in FIG. 12A, the display panel 30 comprises five pixel islands, wherein the five pixels form images on the eye 100 after passing through the respective corresponding microlenses in the microlens array 20. The angular ranges (or regions) of these images are $(\theta_1 \sim \theta_2)$, $(\theta_{0+} \sim \theta_1)$, $(\theta_{0-} \sim \theta_{0+})$, $(\theta_{-1} \sim \theta_{0-})$ and $(\theta_{-2} \sim \theta_{-1})$. These angular ranges are also the field-of-view angles of different pixel islands (only the $\theta$ direction is schematically shown). In this way, the angular ranges of different images are connected, thereby implementing field-of-view mosaicing.

Figure 12B:
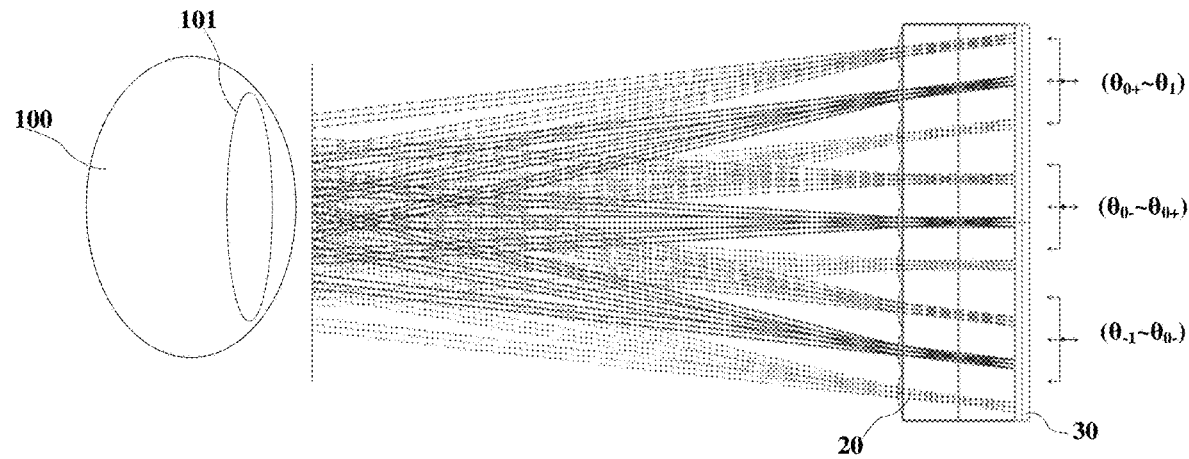
FIG. 12B is a schematic view showing a principle of color mosaicing of a display device according to an embodiment of the present disclosure.

FIG. 12B is a schematic view showing a principle of color mosaicing of a display device according to an embodiment of the present disclosure. FIG. 12B shows the microlens array 20, the display panel 30, the eye 100, and the pupil 101.

As shown in FIG. 12B, in the display panel 30, every three adjacent pixel islands serve as a group of pixel islands. The three pixel islands in each group of pixel islands are respectively a pixel island whose light-emitting color is red, a pixel island whose light-emitting color is green, and a pixel island whose light-emitting color is blue. The field-of-view angles of the three pixel islands in each group of pixel islands (only the θ direction is schematically shown) are the same. That is, the angular ranges of images formed by the three pixel islands in each group of pixel islands are the same. For example, the angular range of the images of the three pixel islands in the first group of pixel islands is ($\theta_{0+}$~$\theta_1$), the angular range of the images of the three pixel islands in the second group of pixel islands is ($\theta_{0-}$~$\theta_{0+}$), and the angular range of the images of the three pixel islands in the third group of pixel islands is ($\theta_{-1}$~$\theta_{0-}$). These three groups of pixel islands achieve field-of-view mosaicing. In each group of pixel islands, images of the sub-pixels of the pixel islands of different colors may be overlapped, so as to achieve color mosaicing of the images.

In some embodiments, in each group of pixel islands, the three pixel islands may be arranged according to RGB or other arrangement manners. The positions of the R, G, and B pixel islands within the same angular range relative to the respective microlenses are the same, and the angular distributions of the light beams emitted by the three pixel islands into the human eye are also the same.

Figure 12C:
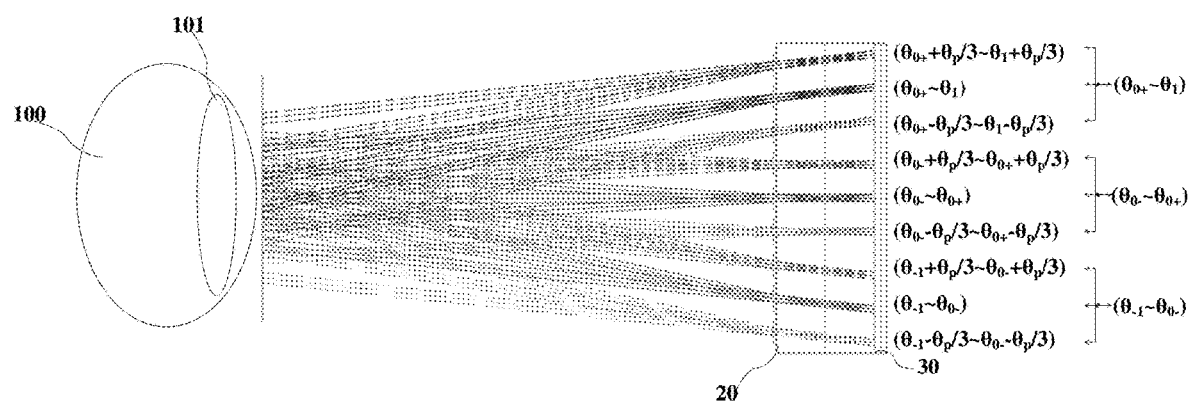
FIG. 12C is a schematic view showing a principle of the increase in resolution of a display device according to an embodiment of the present disclosure.

FIG. 12C is a schematic view showing a principle of the increase in resolution of a display device according to an embodiment of the present disclosure. FIG. 12C shows the microlens array 20, the display panel 30, the eye 100, and the pupil 101.

As shown in FIG. 12C, the pixel islands on the display panel 30 may be divided into three groups. The field-of-view range (i.e., the angular range or region of the image) corresponding to the first group of pixel islands is ($\theta_{0+}$~$\theta_1$), the field-of-view range corresponding to the second group of pixel islands is ($\theta_{0-}$~$\theta_{0+}$), and the field-of-view range corresponding to the third group of pixel islands is ($\theta_{-1}$~$\theta_{0-}$). Here, only the θ direction is schematically shown. These three groups of pixel islands achieve field-of-view mosaicing. Each group of pixel islands has three pixel islands. For example, the angular ranges of the images corresponding to the three pixel islands in the first group of pixel islands are ($\theta_{0+}+\theta_p/3$~$\theta_1+\theta_p/3$), ($\theta_{0+}$~$\theta_1$) and ($\theta_{0+}-\theta_p/3$~$\theta_1-\theta_p/3$), the angular ranges of the images corresponding to the three pixel islands in the second group of pixel islands are ($\theta_{0-}+\theta_p/3$~$\theta_{0+}+\theta_p/3$), ($\theta_{0-}$~$\theta_{0+}$) and ($\theta_{0-}-\theta_p/3$~$\theta_{0+}-\theta_p/3$), and the angular ranges of the images corresponding to the three pixel islands in the third group of pixel islands are ($\theta_{-1}+\theta_p/3$~$\theta_{0-}+\theta_p/3$), ($\theta_{-1}$~$\theta_{0-}$) and ($\theta_{-1}-\theta_p/3$~$\theta_{0-}-\theta_p/3$), where $\theta_p$ is an angular range corresponding to a single sub-pixel.

Here, the positions of the pixel islands (that is, the pixel islands in the same group) for resolution improvement within the same angular range relative to the respective microlenses are substantially the same, and the angular distributions of the light beams emitted by the pixel islands within the same angular range that enter the eye 100 after passing through the microlens are also substantially the same. However, in order to implement improving the resolution, the pixel opening regions in different pixel islands within the same angular range are shifted pixel-level misalignment.

Taking the pixel island corresponding to the ($\theta_{0-}$~$\theta_{0+}$) angular range in FIG. 12C as an example, due to an inherent size of the sub-pixel, the angular interval of the sub-pixels in the corresponding field-of-view is the angular range $\theta_p$ corresponding to a single sub-pixel. If the angular resolution (i.e., visual resolution) is intended to be improved to $\theta_p/3$, in addition to reducing the size of the sub-pixel to ⅓ of the original size, it is also possible to add two pixel islands in the vicinity of the pixel island having the angular range of ($\theta_{0-}$~$\theta_{0+}$) as shown in FIG. 12C. Different from the original pixel island, the pixel opening regions of the sub-pixels of the two added pixel islands are shifted in the opposite direction by ⅓ of the size (for example, a diameter or side length) of the sub-pixel respectively compared to the pixel opening regions of the corresponding sub-pixels of the original pixel island. Correspondingly, the angular ranges corresponding to the two pixel islands are respectively shifted in the opposite direction on the basis of ($\theta_{0-}$~$\theta_{0+}$) by the angular range (that is, $\theta_p/3$) corresponding to ⅓ of the size of the sub-pixel. Therefore, the angular ranges corresponding to the two pixel islands are ($\theta_{0-}+\theta_p/3$~$\theta_{0+}+\theta_p/3$) and ($\theta_{0-}-\theta_p/3$~$\theta_{0+}-\theta_p/3$) respectively. Since the lights from these three pixel islands enter the human eye at the same time, it is equivalent to increasing the angular resolution (the visual resolution) to 3 times the original resolution, thereby achieving improving the visual resolution.

Figure 13:
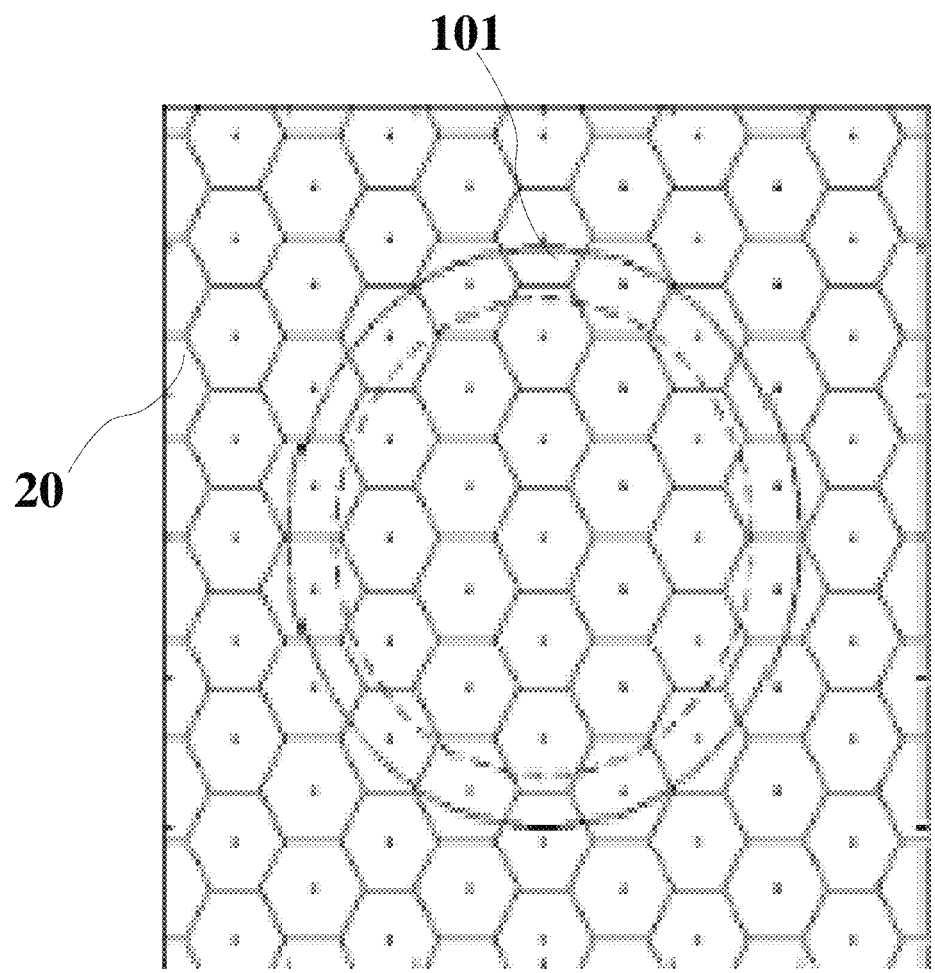
FIG. 13 is a schematic view showing a relationship between a pupil and a microlens array according to an embodiment of the present disclosure.

FIG. 13 is a schematic view showing a relationship between a pupil and a microlens array according to an embodiment of the present disclosure. FIG. 13 shows the microlens array 20 and the pupil 101.

If monochromatic field-of-view mosaicing is required to be implemented, the number of microlenses in single field-of-view of the pupil (the number of microlenses within the pupil projection on the corresponding panel when the human eye is looking toward a certain field-of-view direction) is greater than or equal to 1.

If it is necessary to implement mosaicing three colors, the number of microlenses corresponding to the pupil is at least three.

If it is necessary to increase the resolution of M*N times, the number of microlenses corresponding to the pupil is at least M*N, where M and N are respectively multiples in two orthogonal directions.

If it is necessary to implement field mosaicing, color mosaicing, and resolution improvement at the same time, the number of microlenses corresponding to the pupil is at least 3*M*N, where 3 represents three colors.

Figure 14:
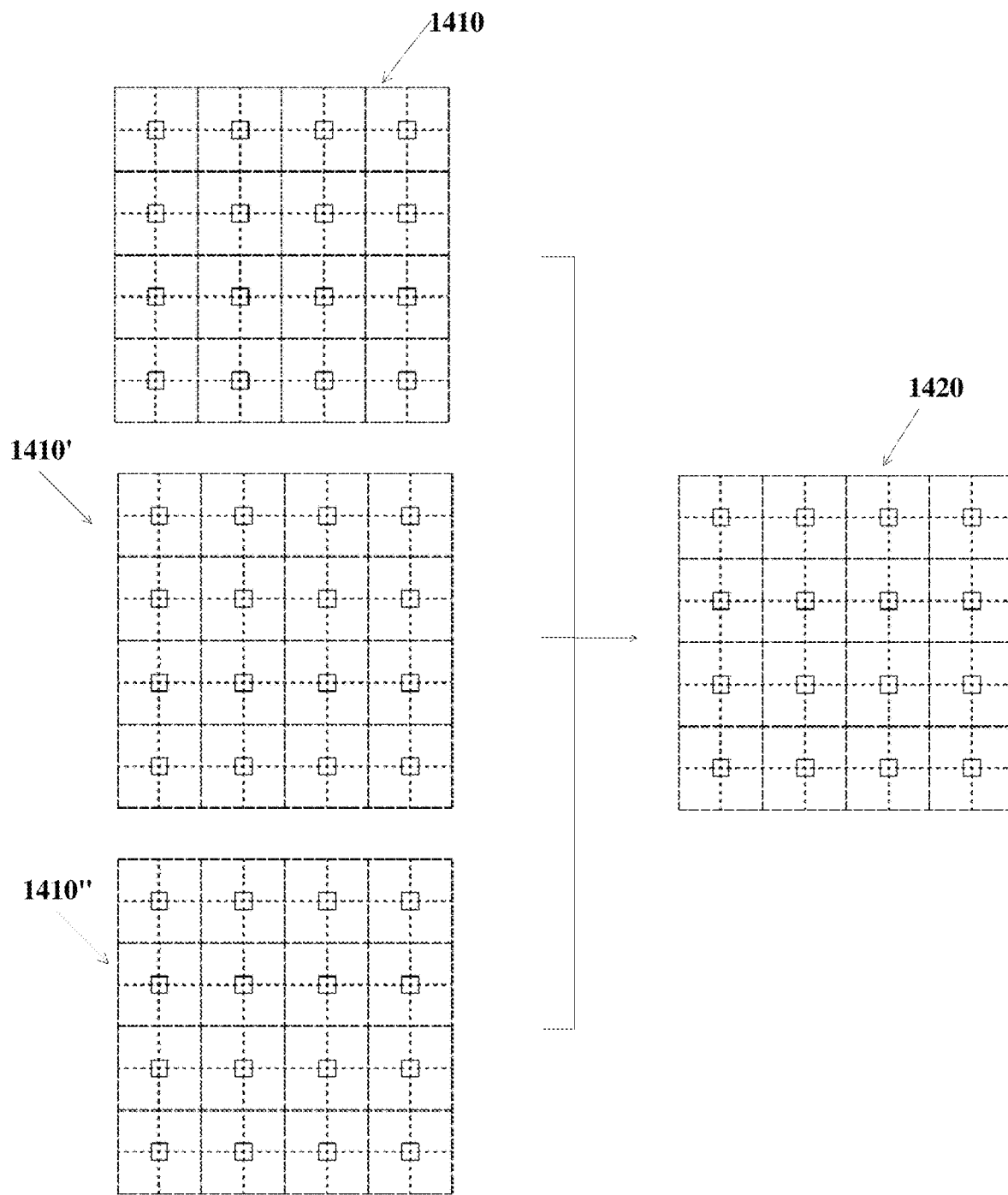
FIG. 14 is a schematic view showing color mosaicing achieved by a display device according to an embodiment of the present disclosure.

FIG. 14 is a schematic view showing color mosaicing achieved by a display device according to an embodiment of the present disclosure.

For example, as shown in FIG. 14, all sub-pixels of a pixel island 1410 are red sub-pixels, all sub-pixels of a pixel island 1410' are green sub-pixels, and all sub-pixels of a pixel island 1410" are blue sub-pixels. When an image is displayed, the light emitted from the pixel opening regions of the respective sub-pixels of the three pixel islands enters the eyes through the respective corresponding microlenses to form virtual images, and these virtual images overlap to form an image 1420, thus achieving the color mosaicing of the image 1420.

Figure 15:
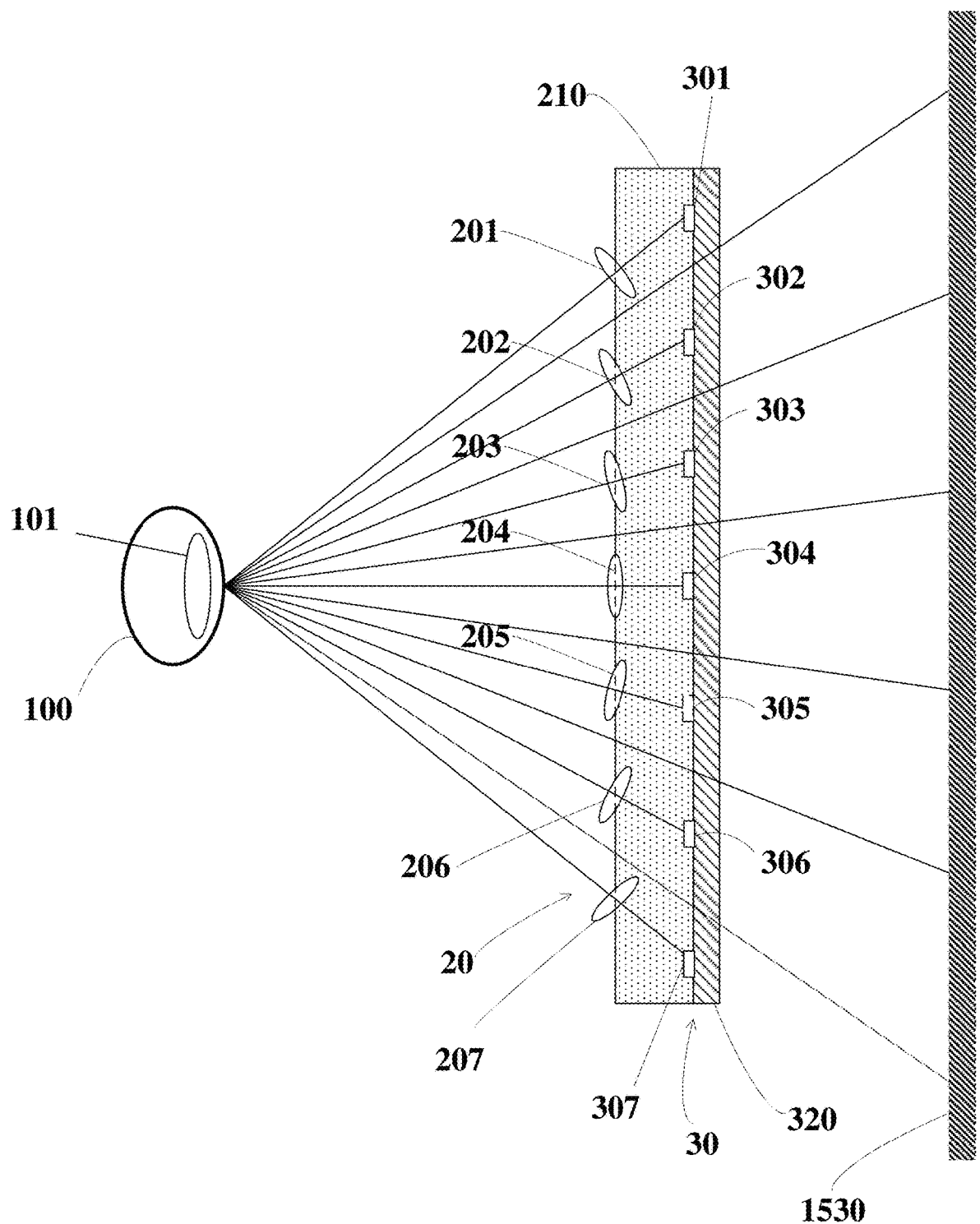
FIG. 15 is a schematic cross-sectional view showing a structure of a display device according to another embodiment of the present disclosure.

FIG. 15 is a schematic cross-sectional view showing a structure of a display device according to another embodiment of the present disclosure.

As shown in FIG. 15, the display device comprises the microlens array 20 and the display panel 30. The microlens array comprises a plurality of microlenses 201 to 207 and a transparent substrate (for example, a glass substrate, a plastic substrate, or the like) 210. The plurality of microlenses 201 to 207 are on a side of the transparent substrate 210 and on the transparent substrate 210. The display panel 30 is on a side of the transparent substrate 210 away from the plurality of microlenses. The display panel 30 comprises a base structure layer 320 and a plurality of pixel islands 301 to 307. The plurality of pixel islands 301 to 307 are on the base structure layer 320, and the plurality of pixel islands are between the base structure layer 320 and the transparent substrate 210. For example, the base structure layer 320 is a substrate. In addition, FIG. 15 also shows the eye 100, the pupil 101, and the virtual image plane 1530.

In some embodiments, as shown in FIG. 15, axial directions of the plurality of microlenses 201 to 207 converge in a same region, and an area of the same region is equal to an area of the pupil. The microlens array may be a free camber gradient microlens array. In this way, the field-of-view can be enlarged, so that the virtual image of the displayed image can be enlarged.

For example, as shown in FIG. 15, the axial directions of the plurality of microlenses 201 to 207 described above may converge at the same point. In this way, it is more favorable for mosaicing the displayed images.

In some embodiments, as shown in FIG. 15, there is a gap between adjacent microlenses, which facilitates achieving a perspective effect by using the gap between the microlenses. This is favorable for applying the display device as an AR device.

Figure 16:
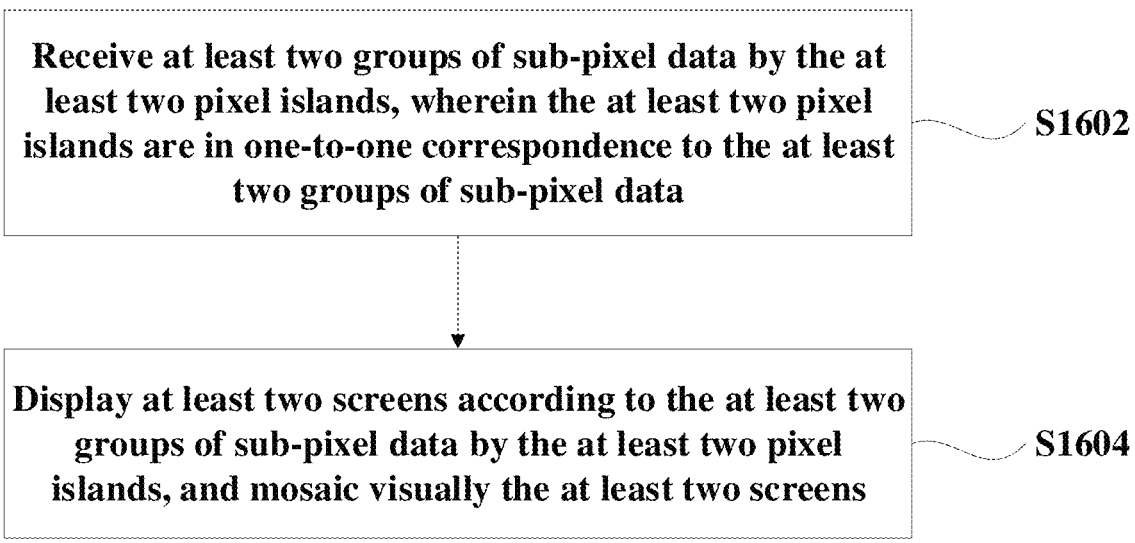
FIG. 16 is a flowchart showing a display method for a display device according to an embodiment of the present disclosure.

FIG. 16 is a flowchart showing a display method for a display device according to an embodiment of the present disclosure. The display device comprises a microlens array and a display panel. The microlens array comprises a plurality of microlenses. The display panel comprises a plurality of pixel islands. The plurality of pixel islands are arranged in one-to-one correspondence with the plurality of microlenses. Each pixel island comprises a plurality of sub-pixels. Light emitted by the plurality of sub-pixels of each pixel island enters the human eye through a microlens corresponding to the each pixel island and forms an image in the human eye. Regions where images formed by at least two pixel islands in the plurality of pixel islands via microlenses corresponding to the at least two pixel islands are located are connected. As shown in FIG. 16, the display method comprises steps S1602 to S1604.

At step S1602, at least two groups of sub-pixel data are received by at least two pixel islands, wherein the at least two pixel islands are in one-to-one correspondence to the at least two groups of sub-pixel data.

At step S1604, at least two screens are displayed according to the at least two groups of sub-pixel data by the at least two pixel islands, and the at least two screens are mosaicked visually.

So far, a display method according to some embodiments of the present disclosure is provided. In the display method, at least two screens displayed by at least two pixel islands according to at least two groups of sub-pixel data are mosaicked, thereby achieving mosaicing of the fields-of-view when the display device displays the screen.

In some embodiments, the plurality of pixel islands comprises a first pixel island and a second pixel island. A region of an image formed by a sub-pixel with a first light-emitting color in the first pixel island via a microlens corresponding to the first pixel island overlaps with a region of an image formed by a sub-pixel with a second light-emitting color in the second pixel island via a microlens corresponding to the second pixel island. The first light-emitting color is different from the second light-emitting color. The display method may further comprise: receiving a first group of sub-pixel data by the first pixel island, and receiving a second group of sub-pixel data by the second pixel island; and displaying a first screen having the first light-emitting color according to the first group of sub-pixel data by the first pixel island, and displaying a second screen having the second light-emitting color according to the second group of sub-pixel data by the second pixel island. The first screen overlaps with the second screen to adjust a screen color. This achieves the color mosaicing of a screen when the display device displays the screen.

In some embodiments, the plurality of pixel islands comprises a first pixel island and a third pixel island. A region of an image formed by the first pixel island via a microlens corresponding to the first pixel island overlaps with a region of an image formed by the third pixel island via a microlens corresponding to the third pixel island, and an image formed by a pixel opening region of at least one sub-pixel in the first pixel island via the microlens corresponding to the first pixel island is between images formed by pixel opening regions of adjacent sub-pixels in the third pixel island via the microlens corresponding to the third pixel island. The display method may further comprise: receiving a first group of sub-pixel data by the first pixel island, and receiving a third group of sub-pixel data by the third pixel island; and displaying a first screen according to the first group of sub-pixel data by the first pixel island, and displaying a third screen according to the third group of sub-pixel data by the third pixel island. The first screen overlaps with the third screen to improve a visual resolution. This may improve the visual resolution of a screen when the display device displays the screen.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above-described embodiments or equivalently substitution of part of the technical features may be made without departing from the scope and spirit of the present disclosure. The scope of the present disclosure is defined by the appended claims.

What is claimed is:

1. A display device, comprising:
 a microlens array comprising a plurality of microlenses; and
 a display panel comprising a plurality of pixel islands, wherein the plurality of pixel islands are arranged in one-to-one correspondence with the plurality of microlenses, each of the plurality of pixel islands comprises a plurality of sub-pixels, the each of the plurality of pixel islands is configured to make light emitted by the plurality of sub-pixels of each of the plurality of pixel islands enter a human eye through a microlens corresponding to the each of the plurality of pixel islands and form an image in the human eye, and regions where images formed by at least two pixel islands in the plurality of pixel islands via microlenses corresponding to the at least two pixel islands are located are connected; wherein:

the plurality of pixel islands comprise a first pixel island and a second pixel island, and a first connection line between a center of the first pixel island and a center of a microlens corresponding to the first pixel island is not parallel to a second connection line between a center of the second pixel island and a center of a microlens corresponding to the second pixel island;

the plurality of pixel islands further comprise a third pixel island, wherein a region of an image formed by the first pixel island via the microlens corresponding to the first pixel island overlaps with a region of an image formed by the third pixel island via a microlens corresponding to the third pixel island, and an image formed by a pixel opening region of at least one sub-pixel in the first pixel island via the microlens corresponding to the first pixel island is between images formed by pixel opening regions of adjacent sub-pixels in the third pixel island via the microlens corresponding to the third pixel island;

the first pixel island comprises a first sub-pixel, the first sub-pixel comprises a first pixel opening region, the third pixel island comprises a second sub-pixel and a third sub-pixel adjacent to the second sub-pixel, the second sub-pixel comprises a second pixel opening region, the third sub-pixel comprises a third pixel opening region, and an image formed by the first pixel opening region via the microlens corresponding to the first pixel island is between images formed by the second pixel opening region and the third pixel opening region via the microlens corresponding to the third pixel island;

wherein a distance between the image formed by the first pixel opening region via the microlens corresponding to the first pixel island and an image formed by the second pixel opening region via the microlens corresponding to the third pixel island is one-nth of a diameter or side length of each of the plurality of sub-pixels, and a diameter or side length of an opening region of each of the plurality of sub-pixels is one-nth of the diameter or side length of each of the plurality of sub-pixels, where n is a multiple of display resolution desired to be improved.

2. The display device according to claim 1, wherein:
in the plurality of pixel islands, a connection line between a center of a pixel island with a viewing angle of 0 degree and a center of a microlens corresponding to the pixel island with the viewing angle of 0 degree is perpendicular to the display panel, and a connection line between a center of a pixel island with a viewing angle other than 0 degree and a center of a microlens corresponding to the pixel island with the viewing angle other than 0 degree is not perpendicular to the display panel.

3. The display device according to claim 1, wherein:
a region of an image formed by a sub-pixel with a first light-emitting color in the first pixel island via the microlens corresponding to the first pixel island overlaps with a region of an image formed by a sub-pixel with a second light-emitting color in the second pixel island via the microlens corresponding to the second pixel island, wherein the first light-emitting color is different from the second light-emitting color.

4. The display device according to claim 1, wherein a projection of each microlens in at least a part of the plurality of microlenses on the display panel at least partially overlaps with a pixel island corresponding to the each microlens.

5. The display device according to claim 1, wherein each of the plurality of pixel islands is at a focal point of the microlens corresponding to the each of the plurality of pixel islands.

6. The display device of claim 1, wherein the plurality of sub-pixels in each of the plurality of pixel islands have a same light-emitting color.

7. The display device of claim 1, wherein the plurality of sub-pixels in each of the plurality of pixel islands comprise a red sub-pixel, a green sub-pixel, and a blue sub-pixel.

8. The display device according to claim 1, wherein the plurality of pixel islands have a same arrangement manner of sub-pixel array.

9. The display device according to claim 1, wherein the microlens array further comprises a transparent substrate, wherein the plurality of microlenses are on the transparent substrate, and the display panel is on a side of the transparent substrate away from the plurality of microlenses.

10. The display device according to claim 9, wherein the display panel further comprises a base structure layer, wherein the plurality of pixel islands are on the base structure layer, and the plurality of pixel islands are between the base structure layer and the transparent substrate.

11. The display device according to claim 1, wherein a diameter of each of the plurality of microlenses ranges from 0.1 millimeter to 3 millimeters.

12. The display device according to claim 1, wherein axial directions of the plurality of microlenses converge in a same region, and an area of the same region is equal to an area of a pupil.

13. The display device according to claim 1, wherein a gap is provided between adjacent microlenses.

14. The display device according to claim 1, wherein the display device is a virtual reality device, an augmented reality device or a mixed reality device.

15. A display method for a display device, the display device comprising a microlens array comprising a plurality of microlenses, and a display panel comprising a plurality of pixel islands, wherein the plurality of pixel islands are arranged in one-to-one correspondence with the plurality of microlenses, each of the plurality of pixel islands comprises a plurality of sub-pixels, the each of the plurality of pixel islands is configured to make light emitted by the plurality of sub-pixels of each of the plurality of pixel islands enter a human eye through a microlens corresponding to the each of the plurality of pixel islands and form an image in the human eye, and regions where images formed by at least two pixel islands in the plurality of pixel islands via microlenses corresponding to the at least two pixel islands are located are connected, wherein: the plurality of pixel islands comprise a first pixel island and a second pixel island, and a first connection line between a center of the first pixel island and a center of a microlens corresponding to the first pixel island is not parallel to a second connection line between a center of the second pixel island and a center of a microlens corresponding to the second pixel island; the plurality of pixel islands further comprise a third pixel island, wherein a region of an image formed by the first pixel island via the microlens corresponding to the first pixel island overlaps with a region of an image formed by the third pixel island via a microlens corresponding to the third pixel island, and an image formed by a pixel opening region of at least one sub-pixel in the first pixel island via the microlens corresponding to the first pixel island is between images formed by pixel opening regions of adjacent sub-pixels in the third pixel island via the microlens corresponding to the third pixel island; the first pixel island comprises a first sub-pixel, the first sub-pixel comprises a first pixel opening region, the third pixel island comprises a second sub-pixel and a third sub-pixel adjacent to the second sub-pixel, the second sub-pixel comprises a second pixel opening region, the third sub-pixel comprises a third pixel opening region, and an image formed by the first pixel opening region via the microlens corresponding to the first pixel island is between images formed by the second pixel opening region and the third pixel opening region via the microlens corresponding to the third pixel island; wherein a distance between the image formed by the first pixel opening region via the microlens corresponding to the first pixel island and an image formed by the second pixel opening region via the microlens corresponding to the third pixel island is one-nth of a diameter or side length of each of the plurality of sub-pixels, and a diameter or side length of an opening region of each of the plurality of sub-pixels is one-nth of the diameter or side length of each of the plurality of sub-pixels, where n is a multiple of display resolution desired to be improved;

the display method comprising:
receiving at least two groups of sub-pixel data by the at least two pixel islands, wherein the at least two pixel islands are in one-to-one correspondence to the at least two groups of sub-pixel data;
displaying at least two screens according to the at least two groups of sub-pixel data by the at least two pixel islands; and
mosaicing visually the at least two screens.

16. The display method according to claim 15, wherein a region of an image formed by a sub-pixel with a first light-emitting color in the first pixel island via a microlens corresponding to the first pixel island overlaps with a region of an image formed by a sub-pixel with a second light-emitting color in the second pixel island via a microlens corresponding to the second pixel island, and the first light-emitting color is different from the second light-emitting color, the display method further comprising:
receiving a first group of sub-pixel data by the first pixel island, and receiving a second group of sub-pixel data by the second pixel island; and
displaying a first screen having the first light-emitting color according to the first group of sub-pixel data by the first pixel island, and displaying a second screen having the second light-emitting color according to the second group of sub-pixel data by the second pixel island, wherein the first screen overlaps with the second screen to adjust a screen color.

17. The display method according to claim 15, wherein further comprising:
receiving a first group of sub-pixel data by the first pixel island, and receiving a third group of sub-pixel data by the third pixel island; and
displaying a first screen according to the first group of sub-pixel data by the first pixel island, and displaying a third screen according to the third group of sub-pixel data by the third pixel island, wherein the first screen overlaps with the third screen to improve a visual resolution.

* * * * *